United States Patent
Otsuka

(10) Patent No.: US 9,673,163 B2
(45) Date of Patent: Jun. 6, 2017

(54) SEMICONDUCTOR DEVICE WITH FLIP CHIP STRUCTURE AND FABRICATION METHOD OF THE SEMICONDUCTOR DEVICE

(75) Inventor: Takukazu Otsuka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 13/275,423

(22) Filed: Oct. 18, 2011

(65) Prior Publication Data

US 2013/0092948 A1    Apr. 18, 2013

(51) Int. Cl.
*H01L 29/20* (2006.01)
*H01L 23/48* (2006.01)
(Continued)

(52) U.S. Cl.
CPC ........ *H01L 24/29* (2013.01); *H01L 23/49827* (2013.01); *H01L 24/13* (2013.01);
(Continued)

(58) Field of Classification Search
CPC ... H01L 2924/01047; H01L 2924/0105; H01L 2224/13144; H01L 2224/13155;
(Continued)

(56) References Cited

U.S. PATENT DOCUMENTS

| | | | | |
|---|---|---|---|---|
| 5,421,507 A | * | 6/1995 | Davis | B23K 35/001 228/194 |
| 2004/0061221 A1 | * | 4/2004 | Schaffer | H01L 24/36 257/723 |

(Continued)

FOREIGN PATENT DOCUMENTS

| | | |
|---|---|---|
| JP | H03191554 A | 8/1991 |
| JP | 4-503480 A | 6/1992 |

(Continued)

OTHER PUBLICATIONS

Physics of Semiconductor Devices, 2nd ed., Sze, S. M., John Wiley & Sons, Inc., 1981, p. 849.*

(Continued)

*Primary Examiner* — Matthew Reames
*Assistant Examiner* — John Bodnar
(74) *Attorney, Agent, or Firm* — Cantor Colburn LLP

(57) ABSTRACT

The semiconductor device having flip chip structure includes: an insulating substrate; a signal wiring electrode disposed on the insulating substrate; a power wiring electrode disposed on the insulating substrate or disposed so as to pass through the insulating substrate; a semiconductor chip disposed in flip chip configuration on the insulating substrate and comprising a semiconductor substrate, a source pad electrode and a gate pad electrode disposed on a surface of the semiconductor substrate, and a drain pad electrode disposed on a back side surface of the semiconductor substrate; a gate connector disposed on the gate pad electrode; and a source connector disposed on the source pad electrode. The gate connector, the gate pad electrode and the signal wiring electrode are bonded, and the source connector, the source pad electrode and the power wiring electrode are bonded, by using solid phase diffusion bonding.

17 Claims, 15 Drawing Sheets

(51) Int. Cl.
  *B23K 20/00* (2006.01)
  *B23K 31/02* (2006.01)
  *H01L 23/00* (2006.01)
  *H01L 23/498* (2006.01)
  *H01L 25/065* (2006.01)
  *H01L 29/78* (2006.01)
  *H01L 29/16* (2006.01)

(52) U.S. Cl.
  CPC .............. *H01L 24/73* (2013.01); *H01L 24/81* (2013.01); *H01L 24/83* (2013.01); *H01L 25/0655* (2013.01); *H01L 24/16* (2013.01); *H01L 24/32* (2013.01); *H01L 29/1608* (2013.01); *H01L 29/2003* (2013.01); *H01L 29/7802* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13166* (2013.01); *H01L 2224/1403* (2013.01); *H01L 2224/14051* (2013.01); *H01L 2224/16225* (2013.01); *H01L 2224/16227* (2013.01); *H01L 2224/2745* (2013.01); *H01L 2224/2746* (2013.01); *H01L 2224/29023* (2013.01); *H01L 2224/29139* (2013.01); *H01L 2224/29144* (2013.01); *H01L 2224/29155* (2013.01); *H01L 2224/29166* (2013.01); *H01L 2224/32245* (2013.01); *H01L 2224/73253* (2013.01); *H01L 2224/8183* (2013.01); *H01L 2224/81091* (2013.01); *H01L 2224/81097* (2013.01); *H01L 2224/81191* (2013.01); *H01L 2224/8383* (2013.01); *H01L 2224/83091* (2013.01); *H01L 2224/83097* (2013.01); *H01L 2924/1305* (2013.01); *H01L 2924/13055* (2013.01); *H01L 2924/13091* (2013.01); *H01L 2924/1461* (2013.01)

(58) Field of Classification Search
  CPC . H01L 2224/13139; H01L 2924/01079; H01L 2224/05639; H01L 2224/05644; H01L 2924/01028; H01L 2224/8183
  USPC ......... 257/686, 724, 778, E21.503, E21.519, 257/E23.23; 228/115
  See application file for complete search history.

(56) References Cited

U.S. PATENT DOCUMENTS

| | | | |
|---|---|---|---|
| 2004/0094790 A1* | 5/2004 | Kanaya | H01L 27/11502 257/300 |
| 2004/0157407 A1* | 8/2004 | Tong | B23K 20/02 438/455 |
| 2006/0151871 A1 | 7/2006 | Mehrotra | |
| 2007/0222072 A1* | 9/2007 | Chang | H01L 21/563 257/737 |
| 2008/0211104 A1* | 9/2008 | Mehrotra | H01L 23/4924 257/762 |
| 2008/0245843 A1* | 10/2008 | Suga et al. | 228/3.1 |
| 2008/0283579 A1* | 11/2008 | Gunturi et al. | 228/121 |
| 2011/0254177 A1* | 10/2011 | Malhan | H01L 23/49844 257/782 |

FOREIGN PATENT DOCUMENTS

| | | |
|---|---|---|
| JP | H11307596 A | 11/1999 |
| JP | 2007059860 A | 3/2007 |
| JP | 2007311528 A | 11/2007 |
| JP | 2010161296 A | 7/2010 |
| WO | 90/09255 A1 | 8/1990 |
| WO | 2006/074165 A2 | 7/2006 |

OTHER PUBLICATIONS

Li et al. "Characteristics of intermetallic and micromechanical properties during thermal ageing of Sn—Ag—Cu flip chip solder interconnects" Wolfson School of Mechanical and Manufacturing Engineering, Loughborough University, Loughborough, Leicestershire LE11 3TU, UK, Aug. 2004.*

Sze (Physics of Semiconductor Devices, 2nd ed., Sze, S. M., John Wiley & Sons, Inc., 1981, p. 849).*

Brian Rowden et al., "High Temperatures SiC Power Module Packaging," Proceedings of the ASME 2009 International Mechanical Engineering Congress & Exposition, IMECE2009, Nov. 13-19, 2009, Lake Buena Vista, Florida, USA, pp. 1-6.

Warren C. Welch et al., "Transfer of Metal MEMS Packages Using a Wafer-Level Solder Transfer Technique," IEEE Transactions on Advanced Packaging, Nov. 2005, pp. 643-649, vol. 28, No. 4, IEEE.

Japanese Notification of Reason(s) for Refusal corresponding to Patent Application No. 2012-093085; Dispatch date Jan. 5, 2016, with English translation.

* cited by examiner

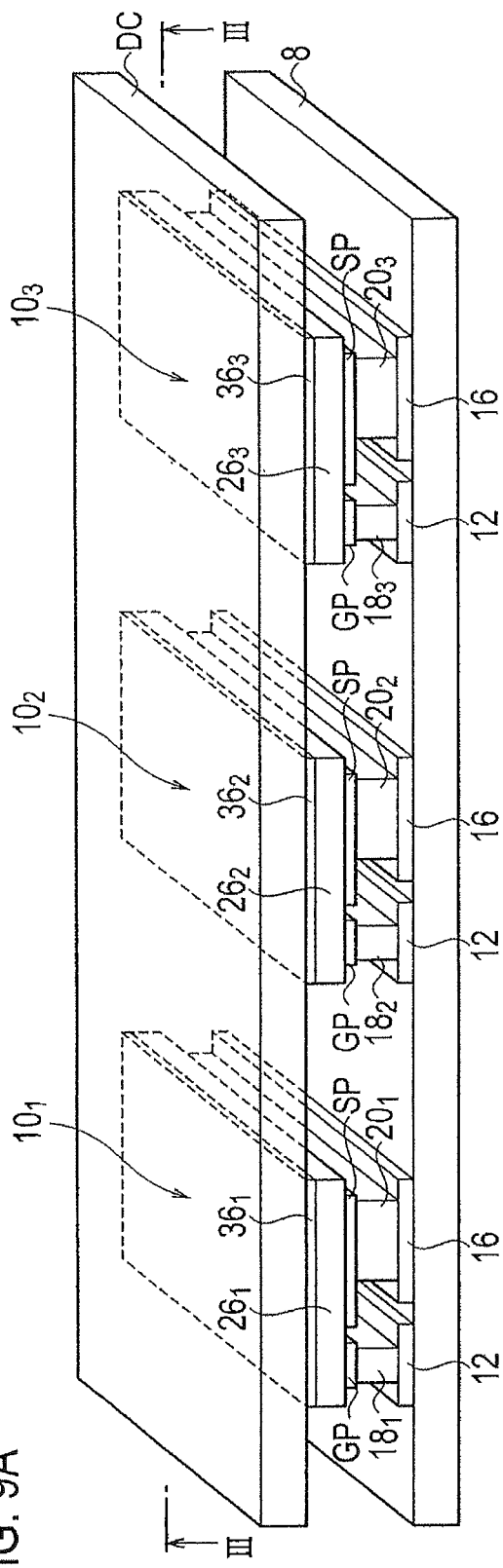
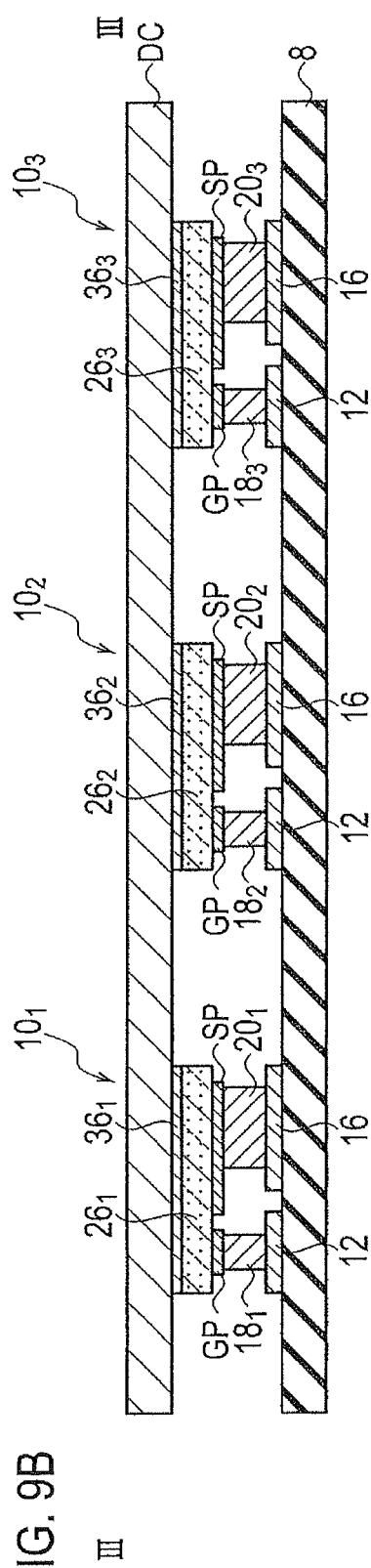
FIG. 9A
FIG. 9B

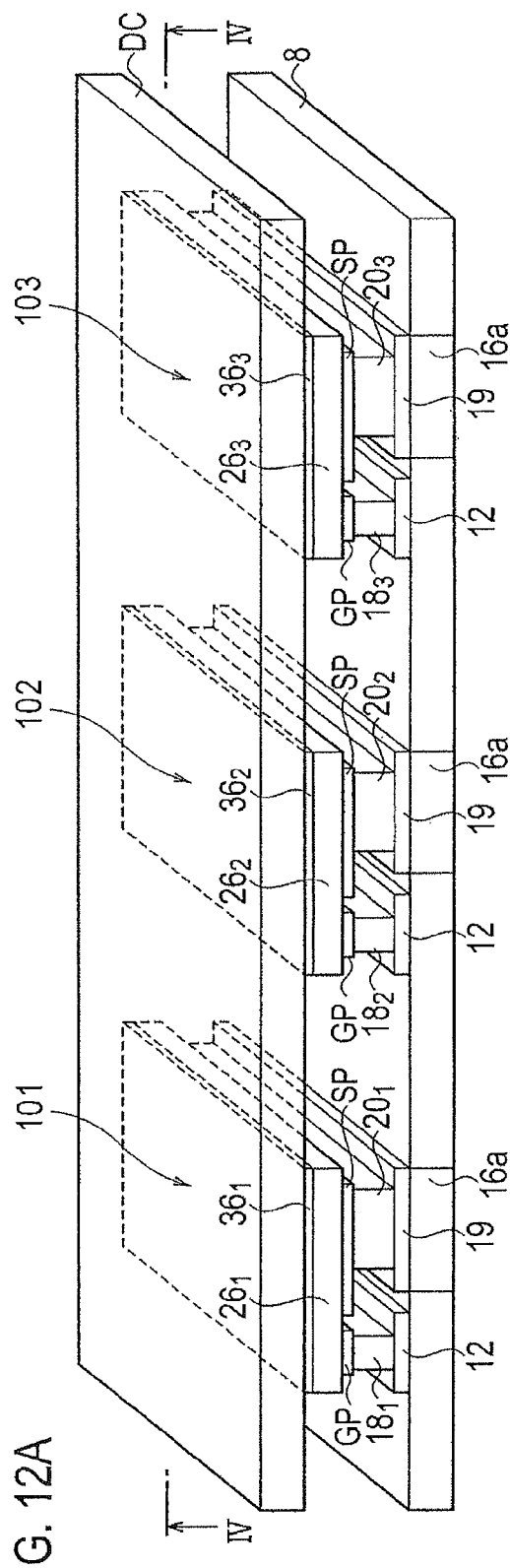
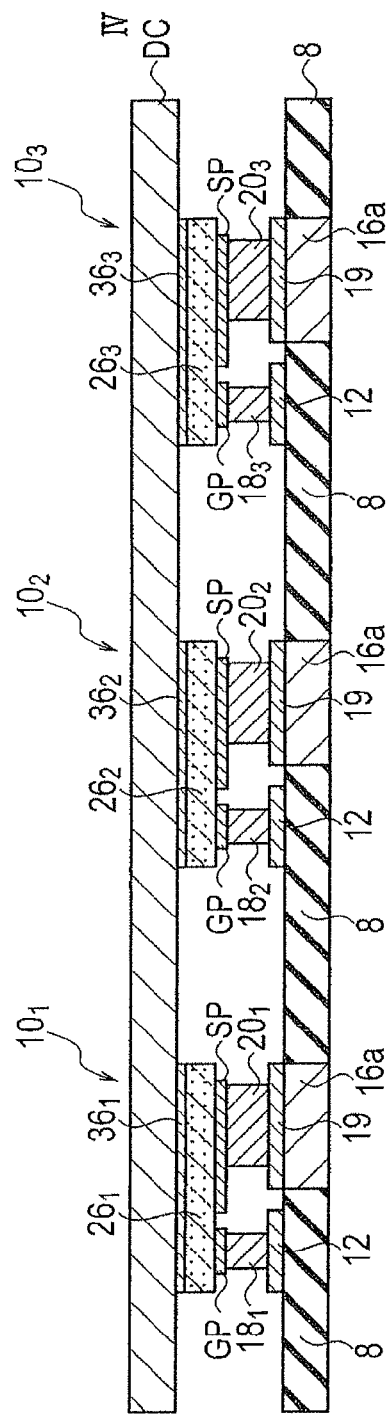

SEMICONDUCTOR DEVICE WITH FLIP CHIP STRUCTURE AND FABRICATION METHOD OF THE SEMICONDUCTOR DEVICE

TECHNICAL FIELD

The present invention relates to a semiconductor device and a fabrication method of such semiconductor device. In particular, the present invention relates to a semiconductor device having a flip chip structure by solid phase diffusion bonding, and a fabrication method of such semiconductor device.

BACKGROUND ART

Recently, research is conducted to develop Silicon Carbide (SiC) devices in many research institutions. As characteristics of the SiC devices, it can be mentioned of low on resistance, high speed switching, high temperature operation, etc.

Conventionally, since an operating range of the Si devices, such as Insulated Gate Bipolar Transistors (IGBTs), currently used in the field of a semiconductor power module was limited to about 150 degrees C., it was possible to drive the Si devices even when using low melting point solder, such as a conventional Sn—Ag alloy based solder.

However, the SiC devices can theoretically operate in temperatures reaching about 400 degrees C. Therefore, if the SiC devices are driven at high temperature when using the conventional low melting point solder, a short circuit between electrodes, a delamination between the SiC device and a base plate, etc. will occur due to fusing of bonding parts where the low melting point solder is used, and thereby compromising reliability of the SiC devices.

Accordingly, the SiC devices could not be driven at high temperature, and therefore the characteristics of the SiC devices were not able to be used.

Nowadays, the bonding under the high temperature melting point has been developed actively. However, taking mass production into consideration, the bonding under the high temperature melting point is not suitable for mass productivity because a period of process time is so long. Since process temperature is also still higher when using the bonding under the high temperature melting point, an excessive stress is applied to materials due to the difference in a coefficient of thermal expansion between individual materials used for fabricating a module, and thereby it cannot secure the reliability of the SiC devices.

It is already disclosed about a method for interconnect between the SiC devices, and a low thermal resistance package (for example, refer to Patent Literature 1 and Patent Literature 2). The Patent Literature 1 and Patent Literature 2 disclose a fabrication method of a package used for housing an SiC device, and also disclose that the SiC device is bonded to other parts or conductive surfaces using Transient Liquid Phase (TLP) bonding technology.

On the other hand, it is already disclosed about a compound solder article whose melting point is comparatively low (e.g., its melting point is not more than 430 degrees C.) including Sn and/or Pb (for example, refer to Patent Literature 3). In Patent Literature 3, the solder alloy has a difference in temperature between the liquid phase and the solid phase smaller than that of the basic solder.

Furthermore, it is already disclosed also about transfer of metal MEMS packages using a wafer-level solder transfer technology (for example, refer to Non Patent Literature 1).

In Non Patent Literature 1, a device wafer and a package cap are bonded by the TLP technology using relatively thin Ni—Sn layer.

It is already disclosed also about a liquid cooling device for cooling a semiconductor element via a cooling device from a back side surface of the semiconductor element (for example, refer to Patent Literature 4).

CITATION LIST

Patent Literature 1: PCT International publication No. WO 2006/074165
Patent Literature 2: United States Patent Application Publication No. 2006/0151871
Patent Literature 3: Published Japanese Translations of PCT International Publication for Patent Application No. H04-503480
Non Patent Literature 1: Warren C. Welch, III, Junseok Chae, and Khalil Najafi, "Transfer of Metal MEMS Packages Using a Wafer-Level Solder Transfer Technique", IEEE TRANSACTION ON ADVANCED PACKAGING, VOL. 28, No. 4, NOVEMBER 2005, pp. 643-649

SUMMARY OF THE INVENTION

Technical Problem

Currently, in order to satisfy a Pb-free request, Sn—Ag based solder etc. which are low melting point solder are generally used. However, as stated above, the low melting point solder cannot be used for a device which can be driven under the high temperature, such as SiC, since the melting temperatures of such the solder are low (about 230 degrees C. at the maximum).

The object of the present invention is to provide a semiconductor device having a flip chip structure whose process temperature becomes lowered temperature and process time length also can be shortened by using solid phase diffusion bonding, and provide a fabrication method of such semiconductor device.

Solution to Problem

According to an aspect of the present invention for achieving the above-mentioned object, provided is a semiconductor device comprising: an insulating substrate; a signal wiring electrode disposed on the insulating substrate; a power wiring electrode disposed on the insulating substrate or disposed so as to pass through the insulating substrate; a semiconductor chip disposed in flip chip configuration on the insulating substrate and comprising a semiconductor substrate, a source pad electrode and a gate pad electrode disposed on a surface of the semiconductor substrate, and a drain pad electrode disposed on a back side surface of the semiconductor substrate; a gate connector disposed on the gate pad electrode; and a source connector disposed on the source pad electrode, wherein between the gate connector and the gate pad electrode, between the gate connector and the signal wiring electrode, between the source connector and the source pad electrode, and between the source connector and the power wiring electrode are bonded by using solid phase diffusion bonding.

According to another aspect of the present invention, provided is a fabrication method of a semiconductor device, the semiconductor device comprising: an insulating substrate; a signal wiring electrode disposed on the insulating substrate; a power wiring electrode disposed on the insulating substrate or disposed so as to pass through the insulating substrate; a semiconductor chip disposed in flip chip configuration on the insulating substrate and comprising a semiconductor substrate, a source pad electrode and a gate pad electrode disposed on a surface of the semiconductor substrate, and a drain pad electrode disposed on a back side surface of the semiconductor substrate; a gate connector disposed on the gate pad electrode; and a source connector disposed on the source pad electrode, the method comprising: forming a gate solid phase diffusion bonding layer by bonding between the gate connector and the gate pad electrode, using solid phase diffusion bonding, and forming a gate connector solid phase diffusion bonding layer by bonding between the gate connector and the signal wiring electrode, using the solid phase diffusion bonding; and forming the source solid phase diffusion bonding layer by bonding between the source connector and the source pad electrode, using the solid phase diffusion bonding, and forming a source connector solid phase diffusion bonding layer by bonding between the source connector and the power wiring electrode, using the solid phase diffusion bonding.

Advantageous Effects of Invention

According to the preset invention, it can provide the semiconductor device having the flip chip structure whose process temperature becomes lowered temperature and process time length also can be shortened by using the solid phase diffusion bonding, and provide the fabrication method of such semiconductor device.

BRIEF DESCRIPTION OF DRAWINGS

FIG. 9A is a schematic bird's-eye view configuration diagram showing a semiconductor device according to a modified example 1 of the embodiment.

FIG. 9B is a schematic cross-sectional configuration diagram taken in the line III-III line of FIG. 9A.

FIG. 12A is a schematic bird's-eye view configuration diagram showing a semiconductor device according to a modified example 3 of the embodiment.

FIG. 12B is a schematic cross-sectional configuration diagram taken in the line IV-IV of FIG. 12A.

DESCRIPTION OF EMBODIMENTS

Figure 1:
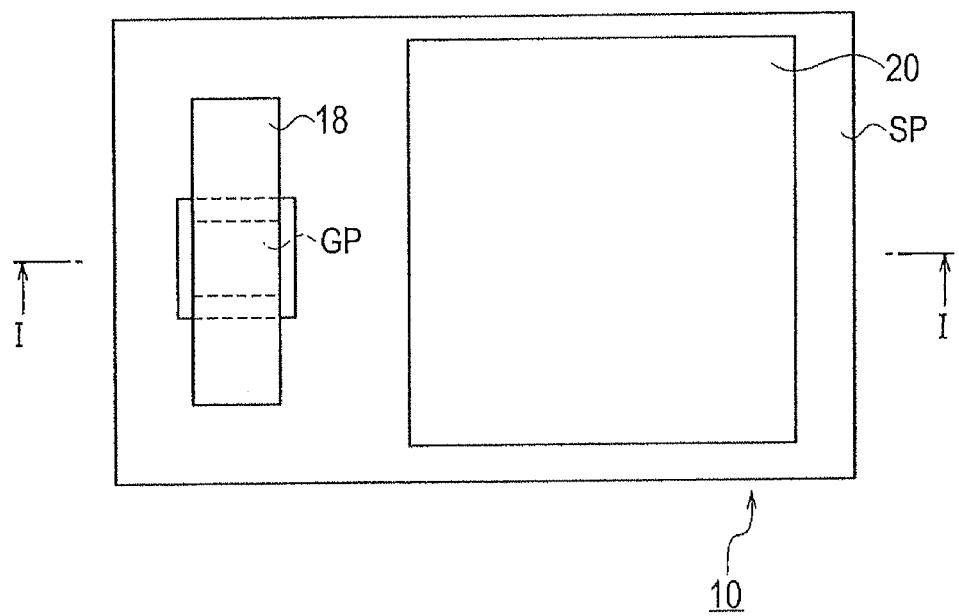
FIG. 1 is a schematic planar pattern configuration diagram showing a semiconductor chip mounted in a semiconductor device according to an embodiment.

Next, embodiments of the invention will be described with reference to drawings. In the description of the following drawings, the identical or similar reference numeral is attached to the identical or similar part. However, it should be known about that the drawings are schematic and the relation between thickness and the plane size and the ratio of the thickness of each layer differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

[Embodiment]

Figure 2:
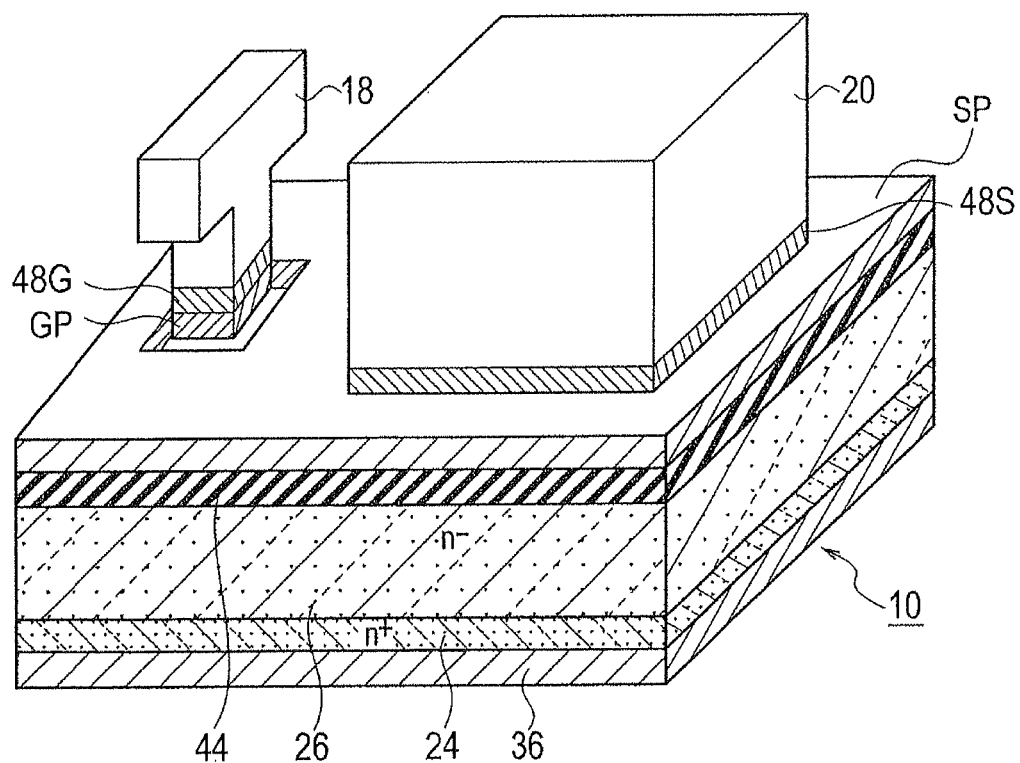
FIG. 2 is a schematic bird's-eye view configuration diagram showing the semiconductor chip mounted in the semiconductor device according to the embodiment.
Figure 3:
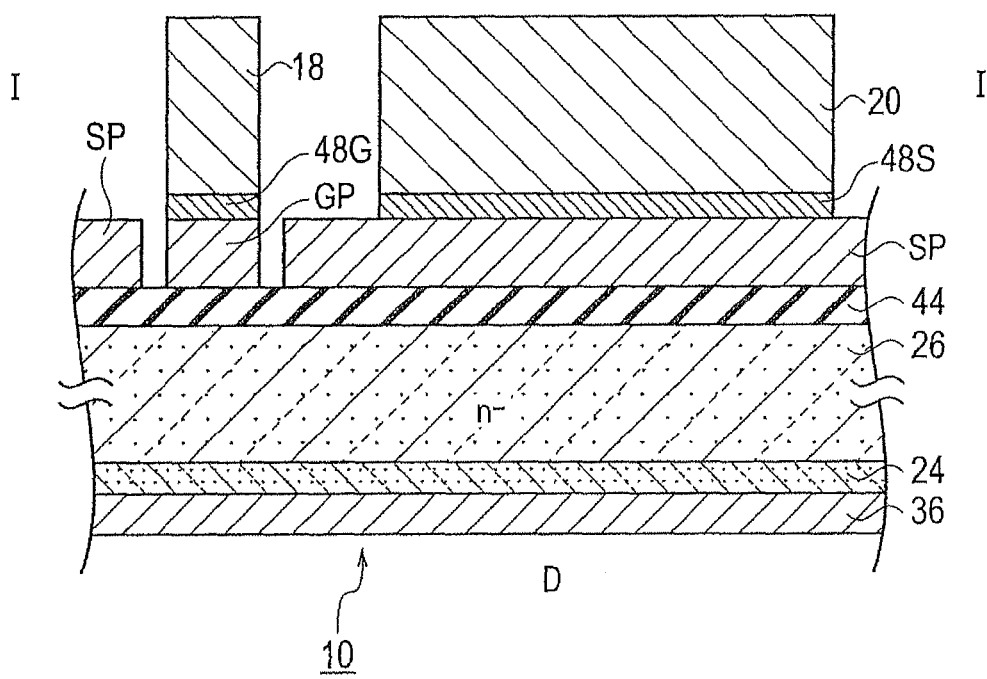
FIG. 3 is a schematic cross-sectional configuration diagram taken in the line I-I of FIG. 1.

A schematic planar pattern configuration of a semiconductor chip (e.g., a power transistor) 10 mounted in a semiconductor device 1 according to a embodiment is represented as shown in FIG. 2, a schematic bird's-eye view structure of the semiconductor chip 10 is represented as shown in FIG. 2, and a schematic cross-sectional configuration taken in the line I-I of FIG. 1 is represented as shown in FIG. 3.

Figure 7:
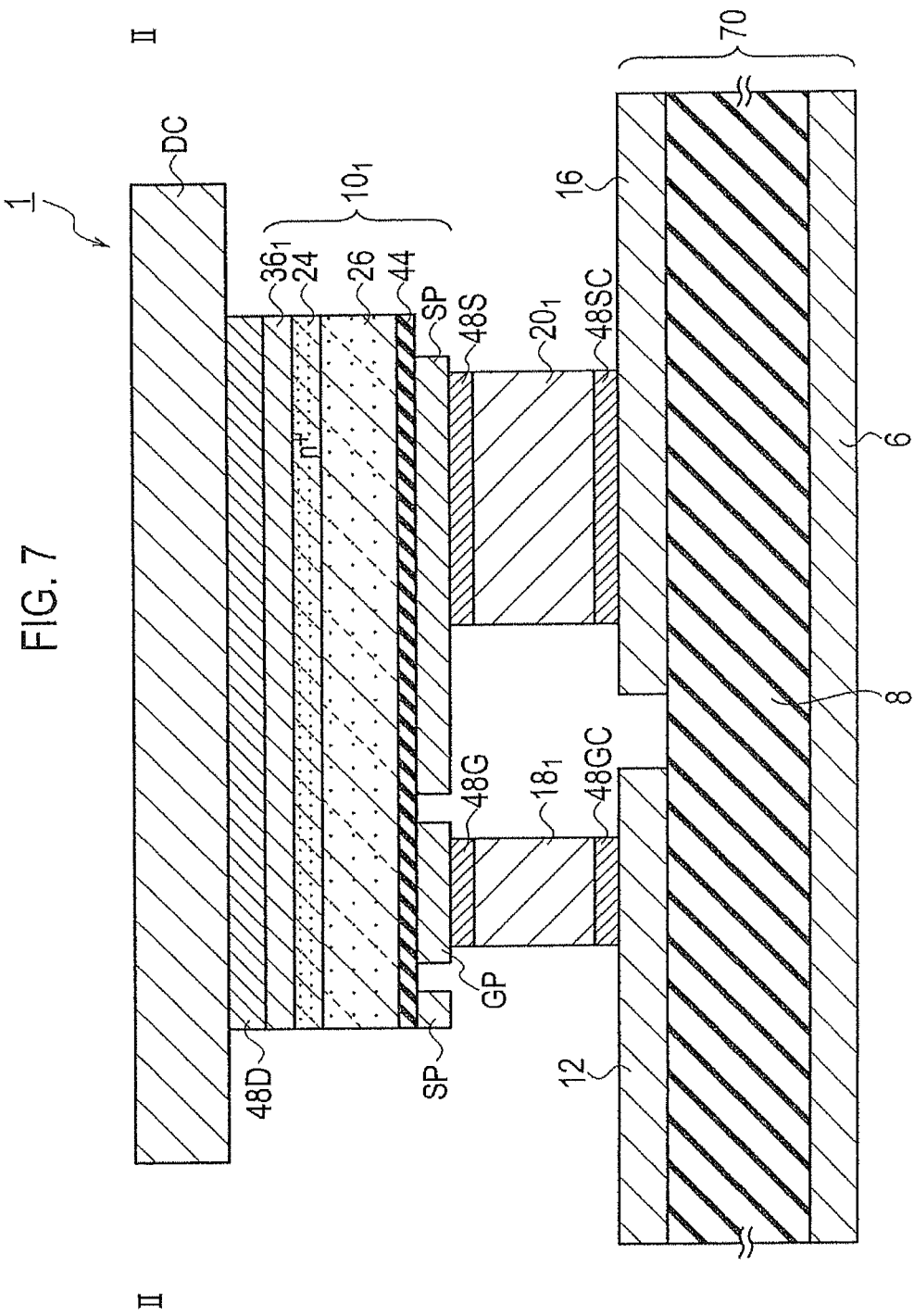
FIG. 7 is a schematic cross-sectional configuration diagram taken in the line II-II of FIG. 6.
Figure 8:
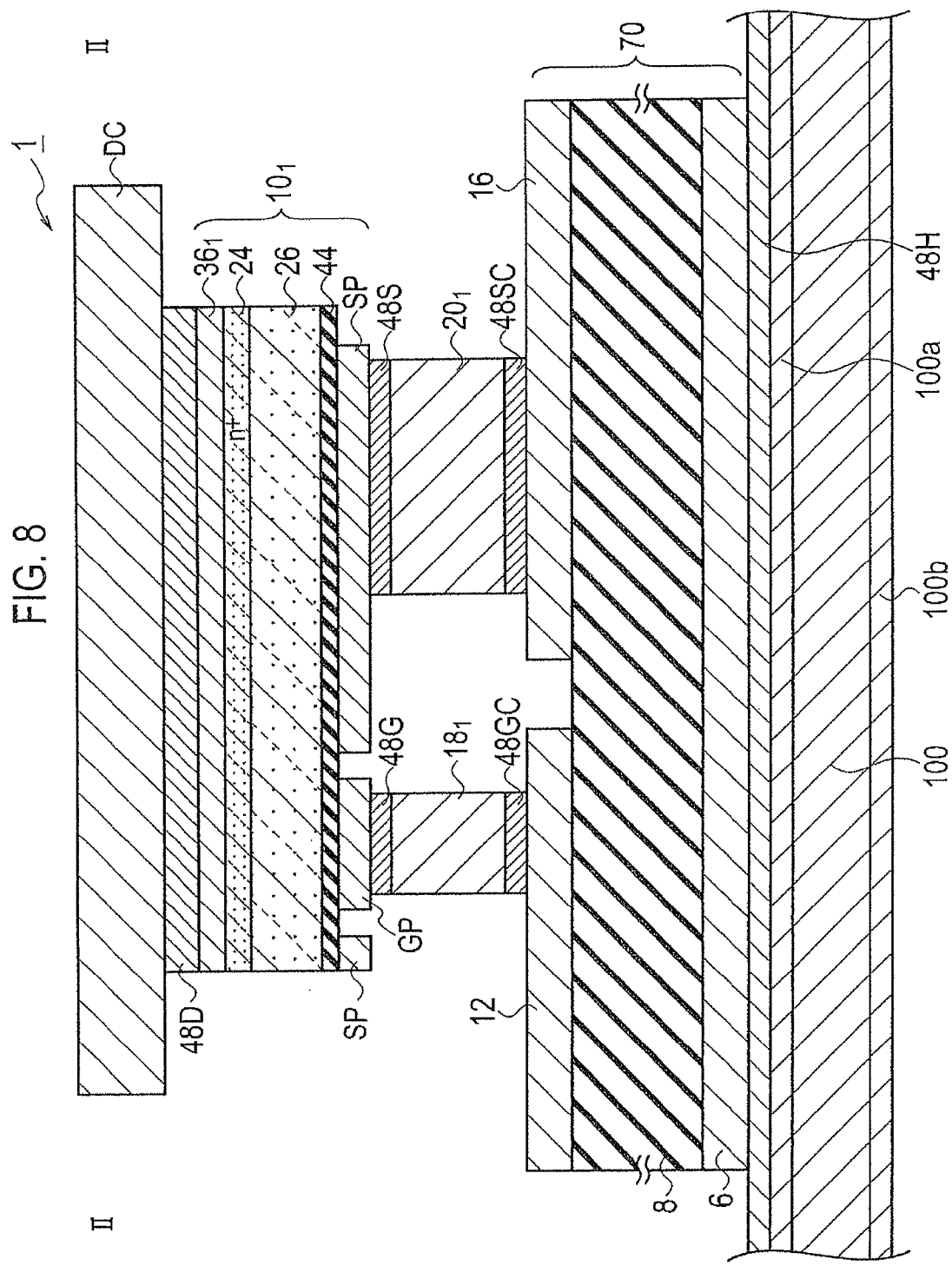
FIG. 8 is a schematic cross-sectional configuration diagram taken in the line II-II of FIG. 6, and is a schematic cross-sectional configuration diagram showing the semiconductor device according to the embodiment mounted on a heat spreader.

As shown in FIG. 1 to FIG. 3, the semiconductor chip 10 mounted in the semiconductor device 1 according to the embodiment includes: a semiconductor substrate 26; a gate pad electrode GP and a source pad electrode SP are disposed on an interlayer insulating film 44 formed on a surface of the semiconductor substrate 26; a gate connector 18 disposed on the gate pad electrode GP via an gate solid phase diffusion bonding layer 48G; a source connector 20 disposed on the source pad electrode SP via a source solid phase diffusion bonding layer 48S; and a drain pad electrode 36 disposed on a drain region 24 formed on a back side surface of the semiconductor substrate 26. The gate connector 18 has a T shaped configuration. Since a detailed structure of the semiconductor chip 10 will be explained in detail in FIGS. 7-8, illustrating of the detailed structure is omitted in FIG. 2.

In FIG. 1, silver (Ag), gold (Au), titanium (Ti), nickel (Ni), etc. may be formed on a surface of the source pad electrode SP and a surface of the gate pad electrode GP. That is, a solid phase diffusion bonding layer 48S may be formed between the source pad electrode SP and the source connector 20 and a solid phase diffusion bonding layer 48G may be also formed between the gate pad electrode GP and the gate connector 18 by forming metal layers composed of Ag, Au, Ti, Ni, etc. on a surface of the semiconductor chip 10 (i.e., on the surface of the source pad electrode SP and the surface of the gate pad electrode GP) by using plating technology, sputtering technology, or vacuum evaporation technology.

Figure 4:
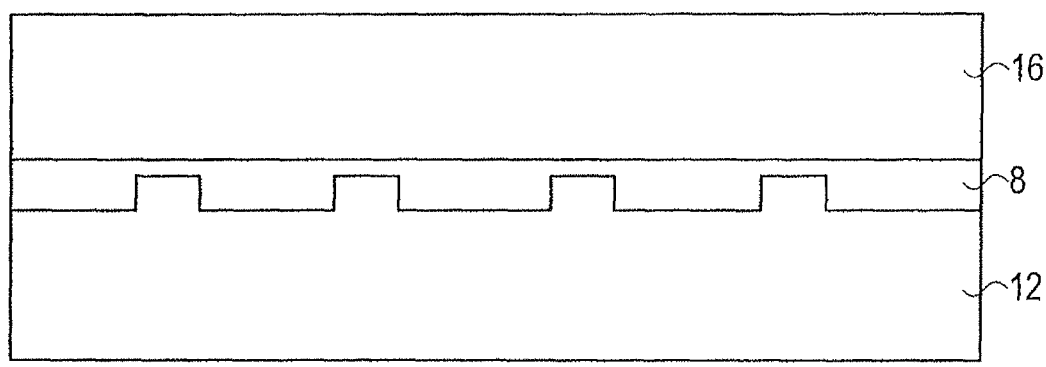
FIG. 4 is a schematic planar pattern configuration diagram showing an insulating substrate for mounting the semiconductor device according to the embodiment.

As shown in FIG. 4, the mounting substrate 70 for mounting the semiconductor device 1 according to the embodiment includes: an insulating substrate 8; and a signal wiring electrode 12 and a power wiring electrode 16 disposed on the insulating substrate 8.

Figure 5:
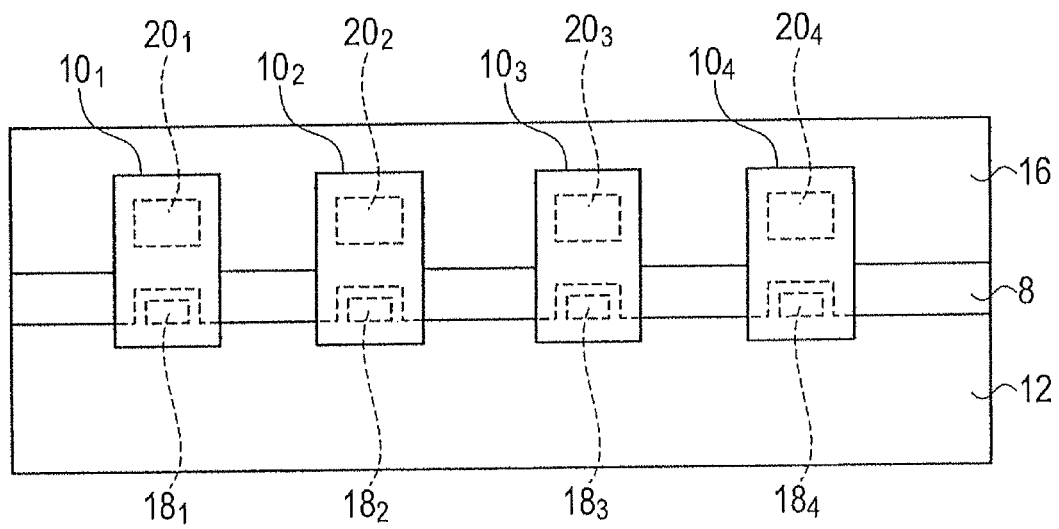
FIG. 5 is a schematic planar pattern configuration diagram for explaining an aspect that a plurality of the semiconductor chips are mounted in flip chip configuration on the insulating substrate shown in FIG. 4.
Figure 6:
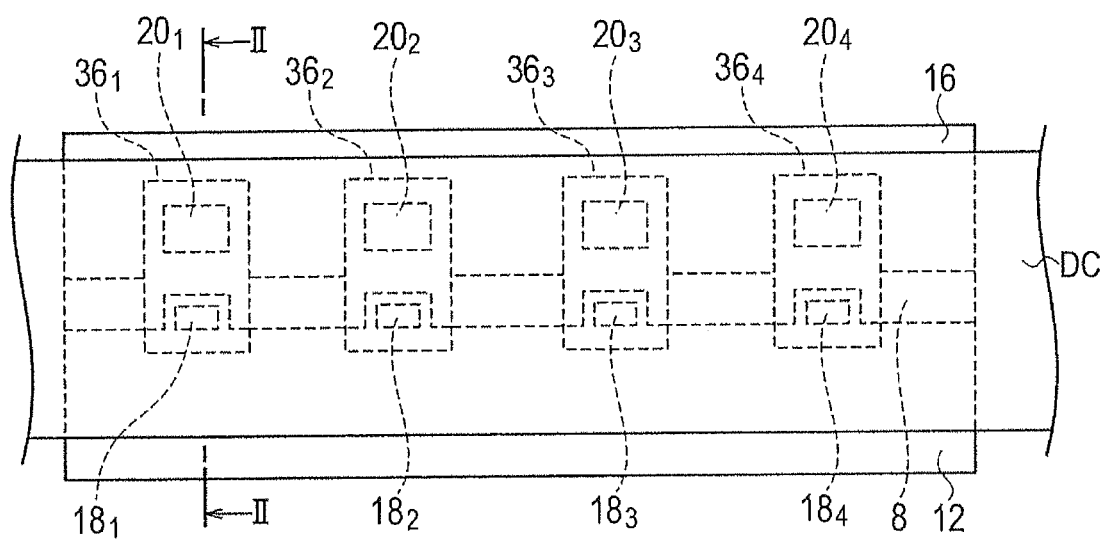
FIG. 6 is a schematic planar pattern configuration diagram showing the semiconductor device according to the embodiment in which the plurality of the semiconductor chips are mounted in flip chip configuration on the insulating substrate shown in FIG. 4.

FIG. 5 shows a schematic planar pattern configuration for explaining an aspect that a plurality of the semiconductor chips $10_1$, $10_2$, $10_3$ and $10_4$ are mounted in flip chip configuration on the mounting substrate 70 of FIG. 4. Also, FIG. 6 shows a schematic planar pattern configuration showing the semiconductor device 1 according to the embodiment in which the plurality of the semiconductor chips $10_1$, $10_2$, $10_3$ and $10_4$ are mounted in flip chip configuration on the mounting substrate 70 of FIG. 4. FIG. 7 shows a schematic cross-sectional structure taken in the line II-II of FIG. 6. FIG. 8 is a schematic cross-sectional configuration diagram taken in the line IV-IV of FIG. 6, and is a schematic cross-sectional configuration diagram showing the semiconductor device according to the embodiment mounted on a heat spreader 100. In this case, although disclosing about the configuration example of the plurality of the semiconductor chips 10 disposed in parallel, only one semiconductor chip 10 may be disposed. In addition, the interlayer insulating film 44 formed on the surface of the semiconductor substrate 26 is omitted in FIGS. 7-8.

As shown in FIG. 1 to FIG. 8, the semiconductor device 1 according to the embodiment includes: an insulating substrate 8; a signal wiring electrode 12 disposed on the insulating substrate 8; a power wiring electrode 16 disposed on the insulating substrate 8; semiconductor chips $10_1$, $10_2$, $10_3$ and $10_4$ disposed in flip chip configuration on the insulating substrate 8 and including a semiconductor substrate 26, a source pad electrode SP and a gate pad electrode GP disposed on a surface of the semiconductor substrate 26, and a drain pad electrodes $36_1$, $36_2$, $36_3$ and $36_4$ disposed on a back side surface of the semiconductor substrate 26; gate connectors $18_1$, $18_2$, $18_3$ and $18_4$ disposed on the gate pad electrodes GP; and source connectors $20_1$, $20_2$, $20_3$ and $20_4$ disposed on the source pad electrodes SP. In this case, between the gate connectors $18_1$, $18_2$, $18_3$ and $18_4$ and the gate pad electrodes GP, and between the gate connectors $18_1$, $18_2$, $18_3$ and $18_4$ and the signal wiring electrode 12 are bonded by using solid phase diffusion bonding. Similarly, between the source connectors $20_1$, $20_2$, $20_3$ and $20_4$ and the source pad electrodes SP, and between the source connectors $20_1$, $20_2$, $20_3$ and $20_4$ and the power wiring electrode 16 are bonded by using the solid phase diffusion bonding.

In the semiconductor device 1 according to the embodiment, the solid phase diffusion bonding is formed in each of the gate pad electrode GP, the source pad electrode SP and the drain pad electrodes 36 of the semiconductor chip 10 by using the solid phase diffusion technology, and the source pad electrode SP of the semiconductor chip 10 is disposed face down. The semiconductor device 1 according to the embodiment achieves a flip chip structure by face-down disposition so that the gate pad electrode GP and the source pad electrode SP are disposed on the back side surface of the semiconductor chip 10, and the drain pad electrode 36 is disposed on the surface of the semiconductor chip 10. Since the solid phase diffusion bonding is formed in each of the gate pad electrode GP, the source pad electrode SP and the drain pad electrodes 36 of the semiconductor chip 10 by using the solid phase diffusion technology, wirebondless can be perfectly achieved.

Also, as shown in FIG. 8, the semiconductor device 1 according to the embodiment may further include a heat spreader 100 for mounting the mounting substrate 70, and between the mounting substrate 70 and the heat spreader 100 may be also bonded by using the solid phase diffusion bonding.

Yet also, as shown in FIG. 6 to FIG. 8, the semiconductor device 1 according to the embodiment further includes a drain connector DC disposed on the drain pad electrodes $36_1$, $36_2$, $36_3$ and $36_4$, and between the drain pad electrodes $36_1$, $36_2$, $36_3$ and $36_4$ and the drain connector DC is bonded by using the solid phase diffusion bonding.

As shown in FIG. 2, the respective gate connectors $18_1$, $18_2$, $18_3$ and $18_4$ may have T shaped configuration, and the size of contact areas between the respective gate connectors $18_1$, $18_2$, $18_3$ and $18_4$ and the signal wiring electrode 12 may be wider than the size of contact areas between the respective gate connectors $18_1$, $18_2$, $18_3$ and $18_4$ and the respective gate pad electrodes GP. Furthermore, the T shaped configuration of the gate connectors $18_1$, $18_2$, $18_3$ and $18_4$ may take a reverse-V shape (e.g., a plectrum shape, or a tapered shape). Strength of the gate connectors $18_1$, $18_2$, $18_3$ and $18_4$ can be increased by taking such reverse-V shape (e.g., the plectrum shape, or the tapered shape).

As shown in FIG. 5 to FIG. 6, the semiconductor device 1 according to the embodiment includes a plurality of the semiconductor chips $10_1$, $10_2$, $10_3$ and $10_4$, and the respective gate connectors $18_1$, $18_2$, $18_3$ and $18_4$ of the semiconductor chips $10_1$, $10_2$, $10_3$ and $10_4$ can be simultaneously bonded to the respective gate pad electrodes GP by using the solid phase diffusion bonding.

Similarly, as shown in FIG. 5 to FIG. 6, the semiconductor device 1 according to the embodiment includes a plurality of the semiconductor chips $10_1$, $10_2$, $10_3$ and $10_4$, and the respective source connectors $20_1$, $20_2$, $20_3$ and $20_4$ of the semiconductor chips $10_1$, $10_2$, $10_3$ and $10_4$ can be simultaneously bonded to the respective source pad electrodes SP by using the solid phase diffusion bonding.

Similarly, as shown in FIG. 5 to FIG. 6, the semiconductor device 1 according to the embodiment includes a plurality of the semiconductor chips $10_1$, $10_2$, $10_3$ and $10_4$, and the respective drain pad electrodes $36_1$, $36_2$, $36_3$ and $36_4$ of the semiconductor chips $10_1$, $10_2$, $10_3$ and $10_4$ can be simultaneously bonded to the drain connector DC by using the solid phase diffusion bonding.

As shown in FIG. 6 to FIG. 8, the semiconductor device 1 according to the embodiment may include: gate solid phase diffusion bonding layers 48G formed by using the solid phase diffusion bonding between the respective gate connectors $18_1$, $18_2$, $18_3$ and $18_4$ and the respective gate pad electrodes GP; and gate connector solid phase diffusion bonding layers 48GC formed by using the solid phase diffusion bonding between the respective gate connectors $18_1$, $18_2$, $18_3$ and $18_4$ and the respective signal wiring electrodes 12.

Similarly, as shown in FIG. 6 to FIG. 8, the semiconductor device 1 according to the embodiment may include: source solid phase diffusion bonding layers 48S formed by using the solid phase diffusion bonding between the respective source connectors $20_1$, $20_2$, $20_3$ and $20_4$ and the respective source pad electrodes SP; and source connector solid phase diffusion bonding layers 48SC formed by using the solid phase diffusion bonding between the respective source connectors $20_1$, $20_2$, $20_3$ and $20_4$ and the respective power wiring electrodes 16.

Similarly, as shown in FIG. 6 to FIG. 8, the semiconductor device 1 according to the embodiment may include drain solid phase diffusion bonding layers 48D formed by using the solid phase diffusion bonding between the drain connector DC and the respective drain pad electrodes $36_1$, $36_2$, $36_3$ and $36_4$.

Furthermore, in the semiconductor device 1 according to the embodiment, the mounting substrate 70 may include a metal layer 6 disposed on a back side surface of the insulating substrate 8, and may include a heat spreader solid phase diffusion bonding layer 48H formed by using the solid phase diffusion bonding between the metal layer 6 and the heat spreader 100

The gate solid phase diffusion bonding layers 48G, gate connector solid phase diffusion bonding layers 48GC, the source solid phase diffusion bonding layers 48S, the source connector solid phase diffusion bonding layers 48SC, the drain solid phase diffusion bonding layers 48D and the heat spreader solid phase diffusion bonding layer 48H can be formed by bonding one or more kinds of metals selected from the group consisting of Ag, Au, Ti and Ni, using the solid phase diffusion bonding. In this case, one or more kinds of metals selected from the group consisting of Ag, Au, Ti and Ni can be formed by using plating technology, sputtering technology, or vacuum evaporation technology.

Also, the drain connector DC, the source connectors $20_1$, $20_2$, $20_3$ and $20_4$, and the gate connectors $18_1$, $18_2$, $18_3$ and $18_4$ can be formed with one selected from the group consisting of aluminum (Al), copper (Cu), a copper molybdenum (CuMo) alloy, a copper tungsten (CuW) alloy, and Al—SiC.

When forming the solid phase diffusion bonding layers 48G, 48GC, 48S, 48SC, 48D and 48H in the semiconductor device 1 according to the embodiment, it is preferable that: a value of the pressure applied to the respective bonding parts is not less than about 1 MPa but not more than about 100 MPa; and the heating processing temperature is not less than about 200 degrees C. but not more than about 350 degrees C.

MODIFIED EXAMPLE 1

FIG. 9A shows a schematic bird's-eye view configuration diagram showing a semiconductor device 1 according to a modified example 1 of the embodiment, and FIG. 9B shows a schematic cross-sectional configuration diagram taken in the line of FIG. 9A. In the semiconductor device 1 according to the modified example 1 of the embodiment, a plurality of the semiconductor chips $10_1$, $10_2$ and $10_3$ are respectively disposed in flip chip configuration toward the signal wiring electrodes 12 and the power wiring electrodes 16 disposed on the insulating substrate 8, and the drain connector DC is disposed in common on the drain pad electrodes $36_1$, $36_2$ and $36_3$. In the semiconductor device 1 according to the modified example 1 of the embodiment, the respective gate pad electrodes GP and the respective source pad electrodes SP are disposed in parallel, and the gate connectors $18_1$, $18_2$, and $18_3$ disposed on the respective gate pad electrodes GP and the source connectors $20_1$, $20_2$ and $20_3$ disposed on the respective source pad electrodes SP are disposed in parallel mutually in stripe shape. In the semiconductor device 1 according to the modified example 1 of the embodiment, the size of contact areas between the respective gate pad electrodes GP and the respective gate connectors $18_1$, $18_2$, and $18_3$ disposed on the gate pad electrode GP is relatively larger as compared with that of the semiconductor device 1 according to the embodiment, and thereby increasing the bonding strength.

Also in the modified example 1 of the embodiment, the solid phase diffusion bonding layers 48G, 48GC, 48S, 48SC, 48D and 48H are disposed in the same manner (although their illustrations are omitted) as that of the configuration of the semiconductor device 1 according to the embodiment.

Also in the semiconductor device 1 according to the modified example 1 of the embodiment, when forming the solid phase diffusion bonding layers 48G, 48GC, 48S, 48SC, 48D and 48H, it is preferable that: a value of the pressure applied to the respective bonding parts is not less than about 1 MPa but not more than about 100 MPa; and the heating processing temperature is not less than about 200 degrees C. but not more than about 350 degrees C.

MODIFIED EXAMPLE 2

Figure 10:
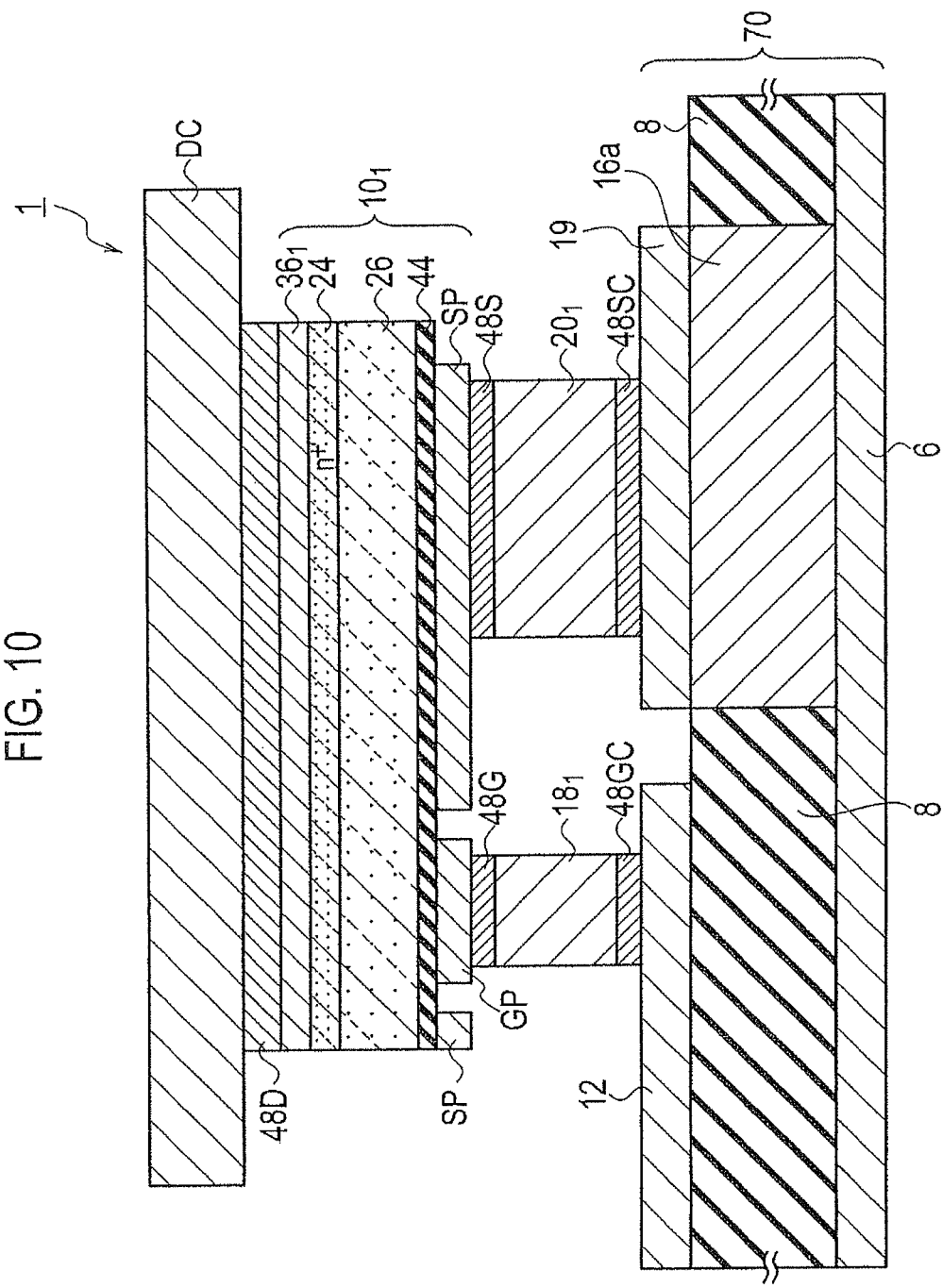
FIG. 10 is a schematic cross-sectional configuration diagram showing a semiconductor device according to a modified example 2 of the embodiment.

As shown in FIG. 10, a semiconductor device 1 according to a modified example 2 of the embodiment includes: an insulating substrate 8; a signal wiring electrode 12 disposed on the insulating substrate 8; a power wiring electrode 16a disposed so as to pass through the insulating substrate 8; a semiconductor chip $10_1$ disposed in flip chip configuration on the insulating substrate 8 and including a semiconductor substrate 26, a source pad electrode SP and a gate pad electrode GP disposed on a surface of the semiconductor substrate 26, and a drain pad electrodes $36_1$ disposed on a back side surface of the semiconductor substrate 26; a gate connector $18_1$ disposed on the gate pad electrode GP; and a source connector $20_1$ disposed on the source pad electrode SP. In this case, between the gate connector $18_1$ and the gate pad electrode GP, and between the gate connector $18_1$ and the signal wiring electrode 12 are bonded by using solid phase diffusion bonding. Similarly, between the source connector $20_1$ and the source pad electrode SP, and between the source connector $20_1$ and the power wiring electrode 16a are bonded by using solid phase diffusion bonding. A configuration shown in FIG. 10 corresponds to the configuration shown in FIG. 7 according to the embodiment.

In the semiconductor device 1 according to the modified example 2 of the embodiment, the power wiring electrode 16a is disposed so as to pass through the insulating substrate 8. In this case, the power wiring electrode 16a is formed of a thick copper plate whose thickness is about 0.5 mm to about 1.0 mm, for example. Furthermore, a silver-plated layer 19, for example, may be formed on the power wiring electrode 16a in order to facilitate the connection between the source connector $20_1$ and the power wiring electrode 16a.

A high electric current of about hundreds amperes can be also conducted in the thickness direction of the insulating substrate 8 via the thick copperplate having low resistance and excellent thermal dispersion characteristics, by disposing the power wiring electrode 16a.

Figure 11:
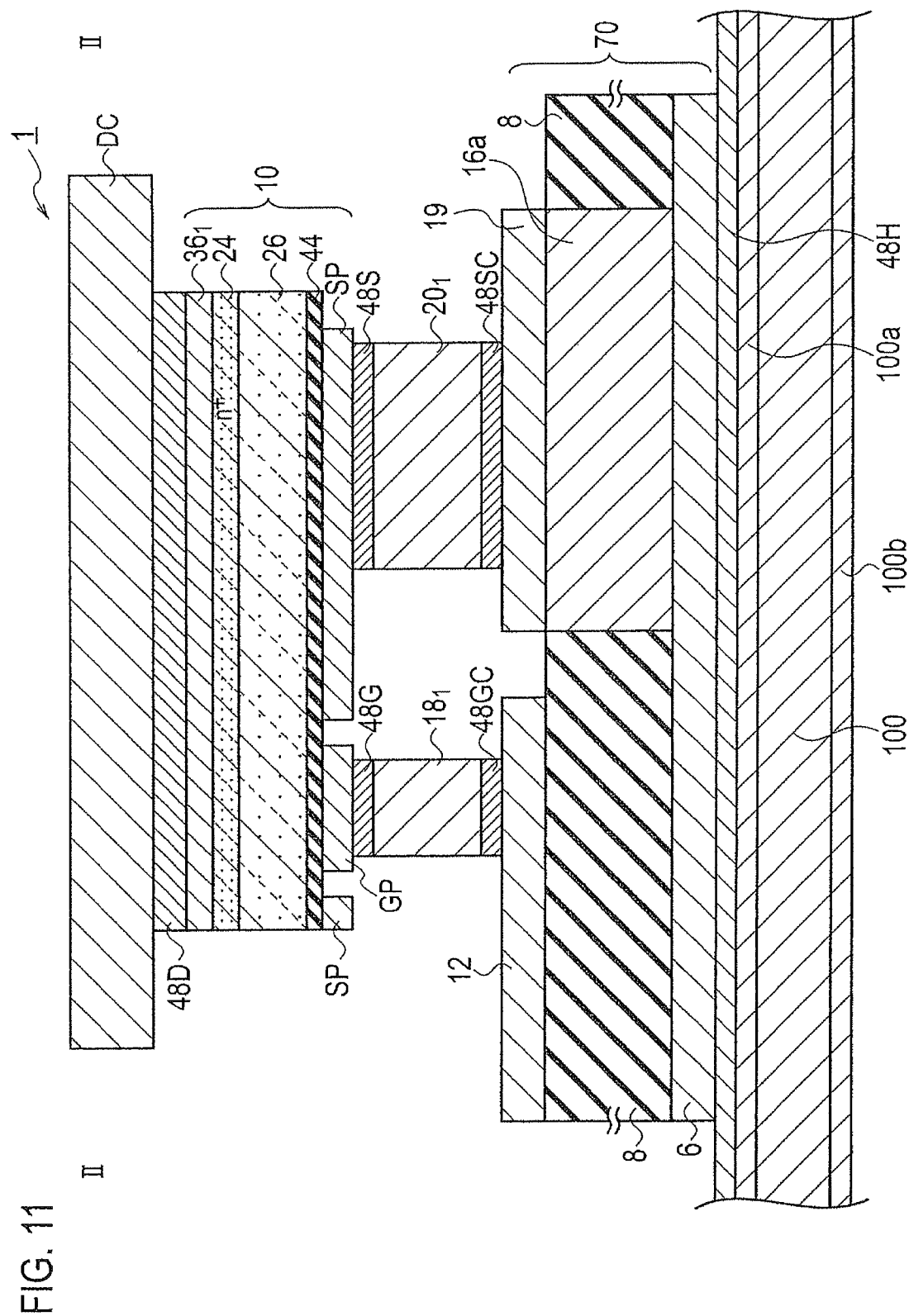
FIG. 11 is a schematic cross-sectional configuration diagram showing the semiconductor device according to the modified example 2 of the embodiment mounted on a heat spreader.

As shown in FIG. 11, the semiconductor device 1 according to the modified example 2 of the embodiment may further include a heat spreader 100 for mounting the mounting substrate 70, and between the mounting substrate 70 and the heat spreader 100 may be also bonded by using the solid phase diffusion bonding. Duplicating explanation is omitted since other configurations are the same as that of the second embodiment.

MODIFIED EXAMPLE 3

FIG. 12A shows a schematic bird's-eye view configuration diagram showing a semiconductor device 1 according to a modified example 3 of the embodiment, and FIG. 12B shows a schematic cross-sectional configuration taken in the line IV-IV of FIG. 12A. In the semiconductor device 1 according to the modified example 3 of the embodiment, a plurality of the semiconductor chips $10_1$, $10_2$ and $10_3$ are disposed in flip chip configuration onto the signal wiring electrodes 12 disposed on the insulating substrate 8 and the power wiring electrodes 16a disposed so as to pass through the insulating substrates 8, and the drain connector DC is disposed in common on the drain pad electrodes $36_1$, $36_2$ and $36_3$. In the semiconductor device 1 according to the modified example 3 of the embodiment, the gate pad electrodes GP and the source pad electrodes SP are disposed in parallel, and the gate connectors $18_1$, $18_2$ and $18_3$ disposed on the respective gate pad electrodes GP and the source connectors $20_1$, $20_2$ and $20_3$ disposed on the respective source pad electrodes SP are disposed in parallel mutually in stripe shape.

Also in the semiconductor device 1 according to the modified example 3 of the embodiment, the power wiring electrode 16a is disposed so as to pass through the insulating substrate 8, in the same manner as that of the modified example 2. Furthermore, a silver-plated layer 19, for example, may be formed on the power wiring electrode 16a in order to facilitate the connection between the source connectors $20_1$, $20_2$ and $20_3$ and the power wiring electrodes 16a. Duplicating explanation is omitted since other configurations are the same as that of the second embodiment.

(Fabrication Method of Semiconductor Device)

As shown in FIG. 7, a fabrication method of the semiconductor device 1 according to the embodiment includes: forming the gate solid phase diffusion bonding layer 48G by bonding between the gate connector $18_1$ and the gate pad electrode GP, using the solid phase diffusion bonding, and forming the gate connector solid phase diffusion bonding layer 48GC by bonding between the gate connector $18_1$ and the signal wiring electrode 12, using the solid phase diffusion bonding; and forming the source solid phase diffusion bonding layer 48S by bonding between the source connector $20_1$ and the source pad electrode SP, using the solid phase diffusion bonding, and forming the source connector solid phase diffusion bonding layer 48SC by bonding between the source connector $20_1$ and the power wiring electrode 16a, using the solid phase diffusion bonding.

As shown in FIG. 7, the fabrication method of the semiconductor device 1 according to the embodiment may further include forming the drain solid phase diffusion bonding layer 48D by bonding between the drain connector DC and the drain pad electrode $36_1$ using the solid phase diffusion bonding.

Furthermore, the forming the gate solid phase diffusion bonding layer 48G and the gate connector solid phase diffusion bonding layer 48GC may be performed simultaneously with the forming the source solid phase diffusion bonding layer 48S and the source connector solid phase diffusion bonding layer 48SC.

Similarly, the forming the drain solid phase diffusion bonding layer 48D may be performed simultaneously with the forming the source solid phase diffusion bonding layer 48S and the source connector solid phase diffusion bonding layer 48SC.

As shown in FIG. 8, the fabrication method of the semiconductor device 1 according to the embodiment may further include forming the heat spreader solid phase diffusion bonding layer 48H by bonding between the metal layer 6 disposed on the back side surface of the insulating substrate 8 and the heat spreader 100, using the sblid phase diffusion bonding.

In the fabrication method of the semiconductor device 1 according to the embodiment, the pressure required for forming the solid phase diffusion bonding is not less than about 1 MPa but not more than about 100 MPa, for example; and the heating processing temperature required for forming the solid phase diffusion bonding is not less than about 200 degrees C. but not more than about 350 degrees C., for example.

(Drain Solid Phase Diffusion Bonding)

Ag, Au, Ti, Ni, etc. are formed on the drain side surface of the semiconductor chip 10 by using plating technology, sputtering technology, or vacuum evaporation technology. For example, a structure of the drain pad electrode 36 in which Ti/Ni/Au/Ag are laminated one after another on the drain region 24 may be formed. Also, when forming the source electrode 34 of the semiconductor chip 10 with Al, an electrode structure in which Ni/Ag are laminated one after another may be formed on such Al.

Also, Ag, Au, Ti, Ni, etc. may be formed on the back side surface of the drain connector DC by using the plating technology, the sputtering technology, or the vacuum evaporation technology.

Ti/nickel/Au/Ag formed on the drain side surface of the semiconductor chip 10 is then contacted with Ag, Au, Ti, Ni, etc. formed on the back side surface of the drain connector DC. The bonding is fundamentally possible in any combination of the materials. Although bonding materials (e.g., solder) are not fundamentally required for the bonding, when the surfaces (e.g., back side surface of the drain connector DC) are rough, an interlayer metal composed of solder (e.g., Ag) and/or the above-mentioned metal (s) may be disposed between the drain side surface of the semiconductor chip 10 and the drain connector DC in order to enhance the contact between the surfaces.

Under such state, the pressure is applied from both of the upper part of the drain connector DC and the lower part of the mounting substrate 70. The value of the pressure is set to not less than about 1 MPa but not more than about 100 MPa, for example. The reason for applying the pressure is for enhancing the contact between the drain side surface of the semiconductor chip 10 and the back side surface of the drain connector DC. Plastic deformation is caused onto the respective surfaces by continuing further applying the pressure under the process of making the contact, and thereby the contact surfaces will be changed to interface. At the time of the process, heat as well as the pressure is also added. The heating processing temperature is set to about 200 degrees C. to about 350 degrees C. According to the heating process, the atomic diffusion which occurs in the interface newly formed on the bonded surface is accelerated, and finally the interface is also disappeared, thereby forming clear bonded surfaces.

The holding time period of the heating processing temperature (about 200 degrees C. to about 350 degrees C.) is about 20 minutes, the total time period of the cooling time from heating processing temperature to normal temperature and the heating time period from normal temperature to heating processing temperature is about 20 minutes to about 40 minutes, and therefore the whole process time period is within about 1 hour.

(Heat Spreader Solid Phase Diffusion Bonding)

Bonding between the insulating substrate 8 and a base plate (e.g., the heat spreader 100) can be formed similarly. That is, metal layers 100a and 100b composed of Ag, Au, Ti, Ni, etc. are formed on the surface of the heat spreader 100 using the plating technology, the sputtering technology, or the vacuum evaporation technology. On the other hand, the metal layers 14 and 6 composed of Ag, Au, Ti, Ni, etc. are also formed on the surface of the insulating substrate 8 using the plating technology, the sputtering technology, or the vacuum evaporation technology.

Next, between the back side surface of the insulating substrate 8 and the surface of the heat spreader 100 are contacted, and the pressure and heat are applied in the same manner as mentioned above, thereby forming the heat spreader solid phase diffusion bonding layer 48H.

Next, the gate solid phase diffusion bonding layer 48G may be formed between the gate connector 18 and the gate pad electrode GP on the side of back side surface of the semiconductor chip 10, and the source solid phase diffusion bonding layer 48S may be also formed between the source connector 20 and the source pad electrode SP.

Next, between the surface of the drain pad electrode 36 of the semiconductor chip 10 and the back side surface of the drain connector DC may be contacted, the pressure and the heat may be applied in the same manner as mentioned above, and thereby the drain solid phase diffusion bonding layer 48D may be formed.

In addition, the order of forming the solid phase diffusion bonding layer is not limited in the above-mentioned order (i.e., the heat spreader solid phase diffusion bonding layer 48H—the gate solid phase diffusion bonding layer 48G—the source solid phase diffusion bonding layer 48S—the drain solid phase diffusion bonding layer 48D), but suitable order can be selected. For example, firstly the drain solid phase diffusion bonding layer 48D, the source solid phase diffusion bonding layer 48S and the gate solid phase diffusion bonding layer 48G may be formed by simultaneous processes, and, finally the heat spreader solid phase diffusion bonding layer 48H may be formed.

(Source Solid Phase Diffusion Bonding and Gate Solid Phase Diffusion Bonding)

As shown in FIG. 2, in the fabrication method of the semiconductor device 1 according to the embodiment, first of all, the source connector 20 and the gate connector 18 for being bonded to the source pad electrode SP and the gate pad electrode GP are prepared. Materials having high electrical conductivity, high thermal conductivity, and a coefficient of thermal expansion near that of the semiconductor chip 10 to be mounted are fundamentally selected as materials of the source connector 20 and the gate connector 18. For example, it is selectable from materials (e.g., Al and Cu), as the materials having high electrical conductivity and high thermal conductivity. Alternatively, it is selectable from materials, such as, CuMo, CuW, Al—SiC, from the viewpoint of the materials having a coefficient of thermal expansion near that of the semiconductor chip 10 to be mounted. Ag, Au, Ti, Ni, etc. may be formed on a surface of the materials of the source connector 20 and gate connector 18, using the plating technology, the sputtering technology, or the vacuum evaporation technology.

Next, metal layers (not shown) composed of Ag, Au, Ti, Ni, etc. are formed on the source pad electrode SP and the gate pad electrode GP, using the plating technology, the sputtering technology, or the vacuum evaporation technology.

In this case, materials of the metal layers can be changed depending on the materials of the source connector 20 and the gate connector 18 to be bonded by using the solid phase diffusion bonding. For example, when the source connector 20 and the gate connector 18 are covered with an Ag plating layer, it is also possible to form the metal layers composed of Ag using the plating technology, the sputtering technology, or the vacuum evaporation technology on the source pad electrode SP and the gate pad electrode GP, thereby facilitating the solid phase diffusion bonding between Ag—Ag.

On the other hand, when the source pad electrode SP and the gate pad electrode GP are formed with Al, it is effective to perform Ni plating onto the source connector 20 and the gate connector 18 in order to inhibit oxidation of Al. Since Al is an extremely soft metal, plastic deformation occurs easily under the solid phase diffusion bonding process. However, a state in a minimum amount of an oxide film is achieved by applying the Ni plating onto the source connector 20 and the gate connector 18, and thereby facilitating the solid phase diffusion bonding.

A configuration of the semiconductor device 1 according to the embodiment after the fabricating process thereof is represented as shown in FIG. 7 to FIG. 8.

As shown in FIG. 7 to FIG. 8, the drain solid phase diffusion bonding layer 48D is formed between the drain pad electrode 36 and the drain connector DC of the semiconductor chip 10, the gate solid phase diffusion bonding layer 48G is formed between the gate connector 18 and gate pad electrode GP, and the gate connector solid phase diffusion bonding layer 48GC is also formed between the gate connector 18 and the signal wiring electrode 12.

Similarly, as shown in FIG. 7 to FIG. 8, the source solid phase diffusion bonding layer 48S is formed between the source connector 20 and source pad electrode SP, and the source connector solid phase diffusion bonding layer 48SC is also formed between the source connector 20 and the power wiring electrode 16.

In the fabrication method of the semiconductor device 1 according to the embodiment, the surface of the drain pad electrode 36 is formed of Ag, for example, and the Ag plating is applied on the back side surface of the drain connector DC, for example, by using the drain solid phase diffusion bonding process between the drain pad electrode 36 and the drain connector DC of the semiconductor chip 10, and thereby the solid phase diffusion bonding layer 48D is formed by bonding between Ag—Ag. A melting temperature of the solid phase diffusion bonding layer 48D is also about 960 degrees C. which is a melting point of Ag.

According to the semiconductor device 1 according to the embodiment, the solid phase diffusion bonding layers 48D, 48S, 48SC, 48H, 48G and 48GC having the high melting point can be obtained by the heating process at relatively low temperatures (about 200 degrees C. to about 350 degrees C.).

Also, in the semiconductor device 1 according to the embodiment, the source pad electrode SP and the gate pad electrode GP are respectively bonded to the source connector 20 and the gate connector 18 by using the solid phase diffusion bonding, the power wiring electrode 16 and the signal wiring electrode 12 are respectively bonded to the source connector 20 and the gate connector 18 by using the solid phase diffusion bonding, and the drain pad electrode 36 is bonded to the drain connector DC by using the solid phase diffusion bonding, thereby achieving perfect wirebondless structure and double-sided cooling structure of the semiconductor chip 10.

The double-sided cooling performance of the semiconductor chip 10 can be further enhanced by bonding the mounting substrate 70 to the heat spreader 100 using the solid phase diffusion bonding.

Since the fabrication method of the semiconductor device 1 according to the modified examples 1-3 of the embodiment is the same as that of the semiconductor device 1 according to the embodiment, duplicating explanation is omitted.

(Configuration Example of Semiconductor Chip)

Figure 13:
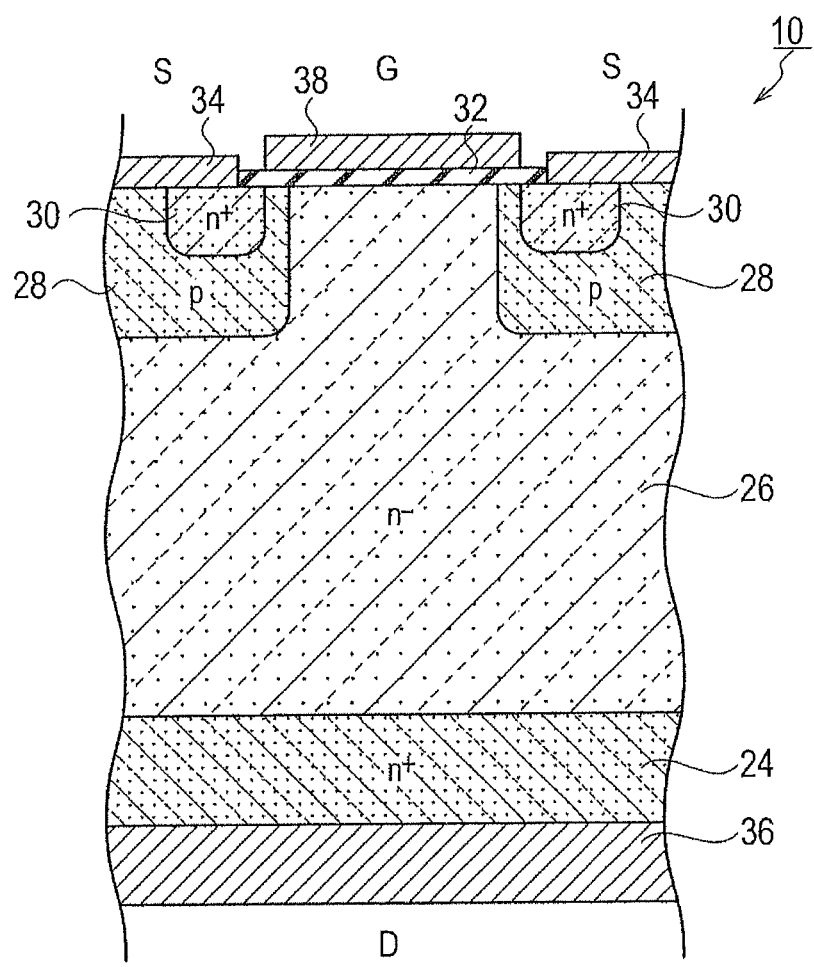
FIG. 13 shows an example of the semiconductor chip applied to the semiconductor device according to the embodiment, and is a schematic cross-sectional configuration diagram showing SiC-MOSFET.

As shown in FIG. 13, as an example of the semiconductor chip 10 applied to the semiconductor device 1 according to the embodiment, a schematic cross-sectional structure of the SiC-MOSFET includes: a semiconductor substrate 26 composed of an n$^-$ type high resistivity layer; P type base regions 28 formed in a surface side of the semiconductor substrate 26; source regions 30 formed in the surface of the p type base regions 28; a gate insulating film 32 disposed on the surface of the semiconductor substrate 26 between the p type base regions 28; a gate electrode 38 disposed on the gate insulating film 32; source electrodes 34 connected to the source regions 30; an n$^+$ type drain region 24 disposed on a back side opposite to the surface of the semiconductor substrate 26; and a drain pad electrode 36 connected to the n$^+$ type drain region 24.

In FIG. 7, although the semiconductor chip 10 is composed of a planar-gate-type n channel vertical SiC-MOSFET, the semiconductor chip 10 may be composed of a trench-gate-type n channel vertical SiC-MOSFET etc.

A GaN based FET etc. instead of the SiC-MOSFET are also applicable to the semiconductor chip 10 applied to the semiconductor device 1 according to the embodiment.

One of an SiC based power device, a GaN based power device or an AlN based power device is applicable to the semiconductor chip 10 applied to the semiconductor device 1 according to the embodiment.

A semiconductor whose bandgap energy is, for example, 1.1 eV to 8 eV can be also used for the semiconductor chip 10 applied to the semiconductor device 1 according to the embodiment.

According to the semiconductor device according to the embodiment, since the solid phase diffusion bonding layers 48G, 48S, 48D and 48H have high heat resistance (e.g., the melting point of metallic silver reaches to about 960 degrees C.), the power device (e.g. SiC based FET and a GaN based FET) can be driven at high temperature by applying the solid phase diffusion bonding layers 48G, 48S, 48D and 48H to the power device.

Figure 14:
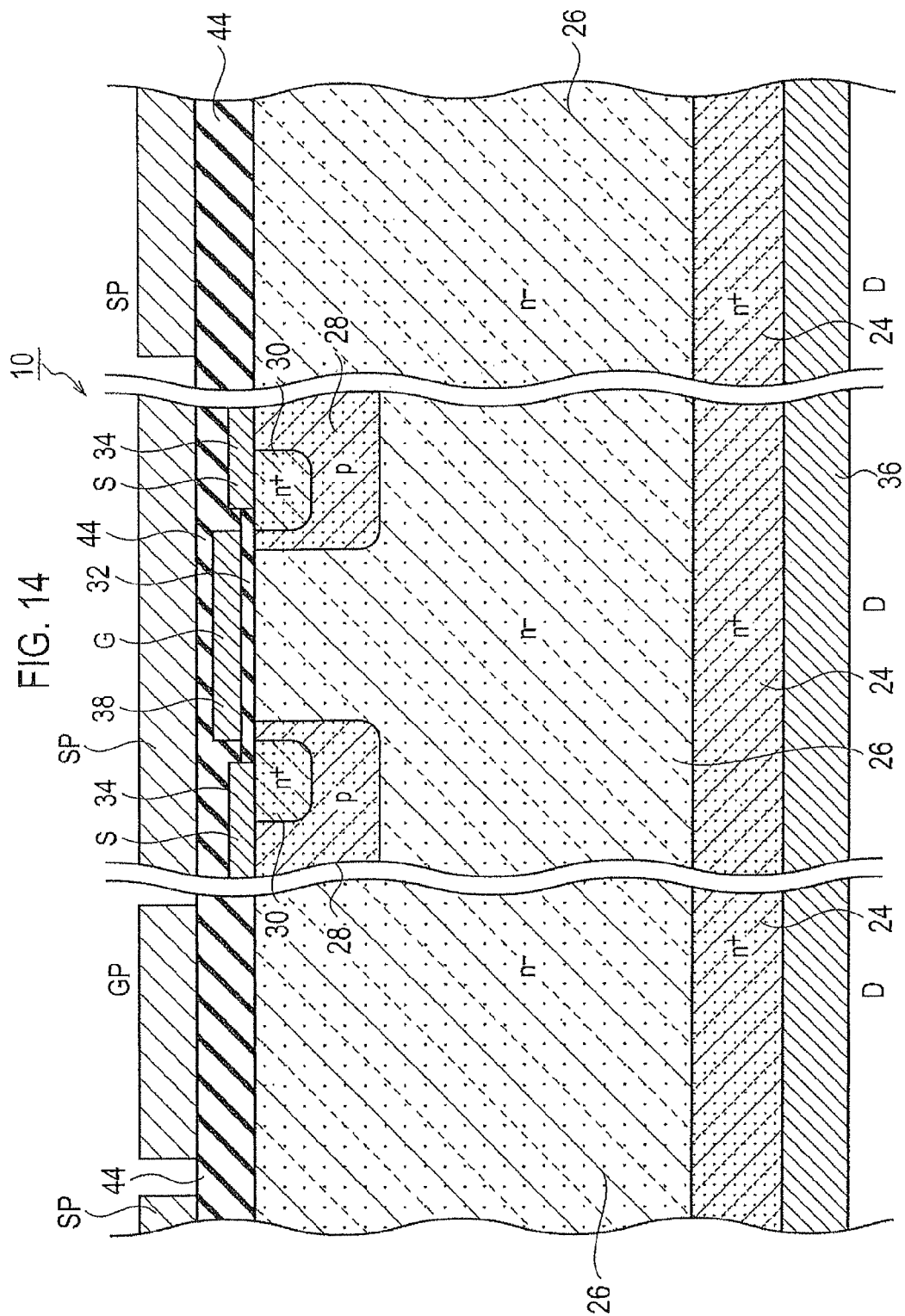
FIG. 14 is an example of the semiconductor chip applied to the semiconductor device according to the embodiment, and is a schematic cross-sectional configuration diagram showing the SiC-MOSFET including a source pad electrode SP and a gate pad electrode GP.

FIG. 14 shows an example of the semiconductor module 10 applied to the semiconductor device according to the embodiment, and is a schematic cross-sectional configuration diagram showing the SiC-MOSFET including a source pad electrode SP and a gate pad electrode GP. The gate pad electrode GP is connected to the gate electrode 38 disposed on the gate insulating film 32, and the source pad electrode SP is connected to the source electrode 34 connected to the source region 30.

As shown in FIG. 14, the gate pad electrode GP and the source pad electrode SP are disposed on the interlayer insulating film 44 for passivation which covers the surface of the semiconductor chip 10. In addition, although omitting illustrating in the configuration example of FIG. 14, a minuscule transistor structure may be formed in the semiconductor substrate 26 under the gate pad electrode GP and the source pad electrode SP, in the same manner as that of FIG. 13 or the central part of FIG. 14.

As shown in FIG. 14, the source pad electrode SP may be disposed to extend onto the interlayer insulating film 44 for passivation, also in the transistor structure of the central part. Alternatively, the gate pad electrode GP may be disposed to extend onto the interlayer insulating film 44 for passivation, in the transistor structure of the central part of FIG. 14.

(Example Applications for Applying Semiconductor Device)

Figure 15:
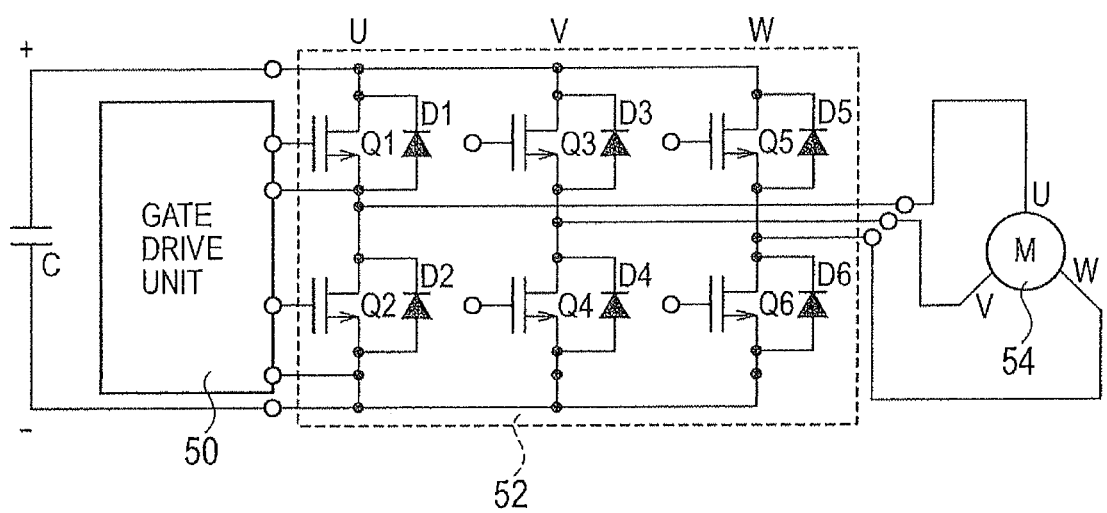
FIG. 15 is a schematic circuit configuration diagram showing a three-phase Alternating Current (AC) inverter configured by applying the semiconductor device according to the embodiment.

Next, a three-phase Alternating Current (AC) inverter configured to use the semiconductor device 1 according to the embodiment is explained, with reference to FIG. 15.

As shown in FIG. 15, the three-phase AC inverter includes a gate drive unit 50, a power module unit 52 connected to the gate drive unit 50, and a three-phase Alternating Current (AC) motor unit 54. Inverters of U phase, V phase and W phase are connected to the power module unit 52 corresponding to U phase, V phase, and W phase of the three-phase AC motor unit 54.

As for the power module unit 52, SiC-MOSFETs Q1 and Q2, Q3 and Q4, and Q5 and Q6 having inverter configurations are connected between a positive terminal (+) and a negative terminal (−) to which the capacitor C is connected. Furthermore, diodes D1 to D6 are connected inversely in parallel between the source and the drain of SiC-MOSFETs Q1 to Q6, respectively.

As mentioned above, the SiC-MOSFETs Q1 to Q6 equivalent to the semiconductor chip 10 applied to the semiconductor device 1 according to the embodiment are electrically connected in flip chip configuration on the mounting substrate 70 or the heat spreader 100 via the solid phase diffusion bonding layers 48G, 48S, 48D and 48H.
(Solid Phase Diffusion Bonding Process)

An actual solid phase diffusion bonding process is performed after forming Ag, Au, Ti, Ni, etc. on the surface of the materials of the source connector 20 and the gate connector 18 by using the plating technology, the sputtering technology, or the vacuum evaporation technology, and forming Ag, Au, Ti, Ni, etc. on the surface of source pad electrode SP and the gate pad electrode GP by using the plating technology, the sputtering technology, or the vacuum evaporation technology.

In a solid phase diffusion bonding process, high pressure (e.g., about 10 MPa to about 100 MPa) is applied and heat (e.g., about 200 degrees C. to about 350 degrees C.) is added at the time of the process. First of all, plastic deformation is caused by the pressure applied in order to contact surfaces of two materials to be bond, and then atomic diffusion is further caused by the heat added thereto, thereby bonding the two materials.

In the fabrication method of the semiconductor device according to the embodiment, bonding between the drain pad electrode 36 and the drain connector DC is also achievable by the above-mentioned solid phase diffusion bonding process.

The pressure is applied from the upper part of the drain connector DC, and also applied from the lower part of the mounting substrate 70. The heat is further added at the same time, and thereby the solid phase diffusion bonding is performed.

Figure 16A:
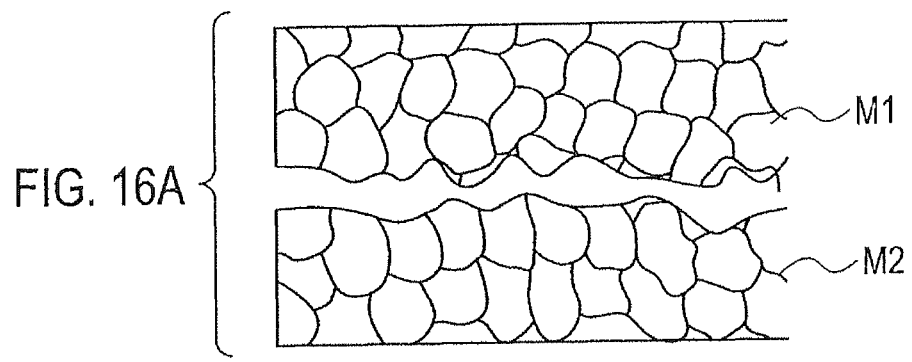
FIG. 16A is a diagram for explaining a solid phase diffusion bonding process applied to the fabrication method for the semiconductor device according to the embodiment, and is a schematic cross-sectional configuration diagram showing an aspect that two metallic materials are opposed mutually.
Figure 16B:
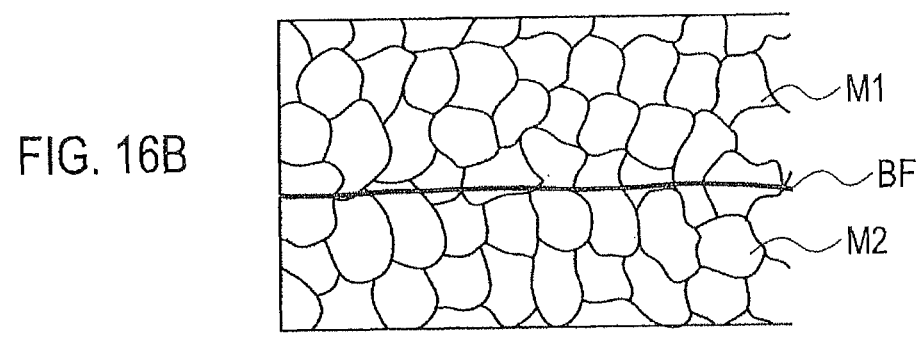
FIG. 16B is a diagram for explaining the solid phase diffusion bonding process applied to the fabrication method for the semiconductor device according to the embodiment, and is a schematic cross-sectional configuration diagram showing an aspect that two metallic materials are contacted to be opposed mutually and their contact interface becomes deformed under high pressure.
Figure 16C:
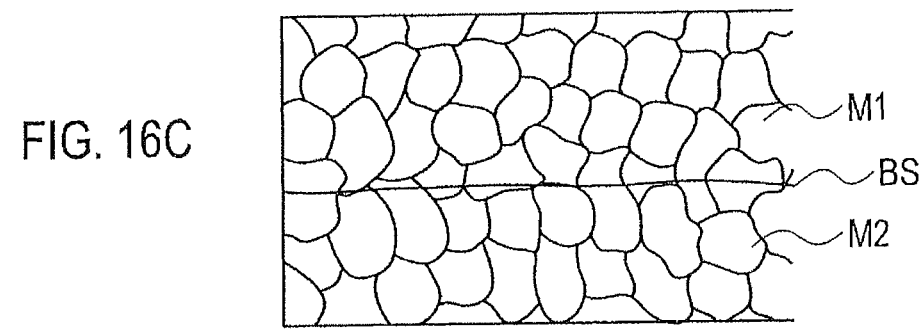
FIG. 16C is a diagram for explaining the solid phase diffusion bonding process applied to the fabrication method for the semiconductor device according to the embodiment, and is a schematic cross-sectional configuration diagram showing an aspect that the contact interface disappears completely and only one interface surface is formed.
Figure 16D:
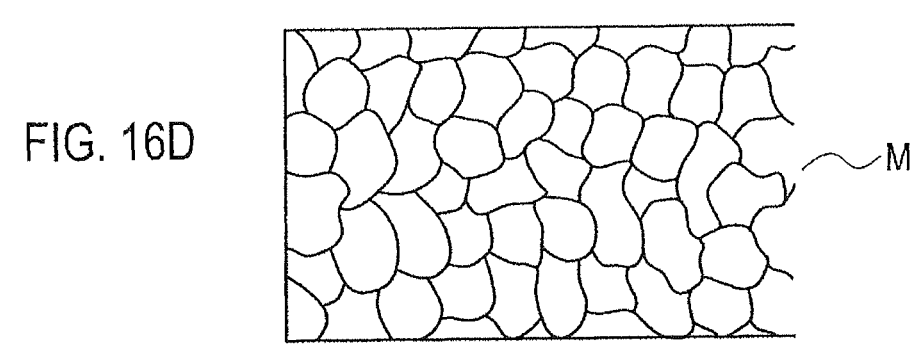
FIG. 16D is a diagram for explaining the solid phase diffusion bonding process applied to the fabrication method for the semiconductor device according to the embodiment, and is a schematic cross-sectional configuration diagram showing an aspect that the interface surface is removed by atomic diffusion and seamless solid phase diffusion bonding is formed.

FIG. 16A is a diagram for explaining a solid phase diffusion bonding process applied to the fabrication method of the semiconductor device 1 according to the embodiment, and is a schematic cross-sectional configuration diagram showing an aspect that two metallic materials M1 and M2 are opposed mutually. FIG. 16B is a schematic cross-sectional configuration diagram showing an aspect that the two metallic materials M1 and M2 are contacted to be opposed mutually and their contact interface BF becomes plastic-deformed under the high pressure. FIG. 16C is a schematic cross-sectional configuration diagram showing an aspect that the contact interface BF disappears completely and only one interface surface BS is formed. FIG. 16D is a schematic cross-sectional configuration diagram showing an aspect that the interface surface BS is removed by atomic diffusion and seamless solid phase diffusion bonding is formed.

(a) First of all, as shown in FIG. 16A, the two metallic materials M1 and M2 are opposed mutually to be adjacent each other.
(b) Next, the two metallic materials M1 and M2 are opposed mutually to be contacted each other, the high pressure (e.g., not less than about 1 MPa but not more than about 100 MPa) is then applied thereto, and thereby the contact interface BF is plastic-deformed, as shown in FIG. 16B.
(c) Next, under the above-mentioned high pressure, when the heating process is performed, the contact interface BF disappears completely and then only one interface surface BS is be formed, as shown in FIG. 16C. The heating processing temperature at this time is not less than about 200 degrees C. but not more than about 350 degrees C., for example.
(d) When further continuing the heating process under the above-mentioned high pressure, the interface surface BS of the two metallic materials M1 and M2 are removed by the atomic diffusion, and thereby forming seamless solid phase diffusion bonding, as shown in FIG. 16D.

Figure 17:
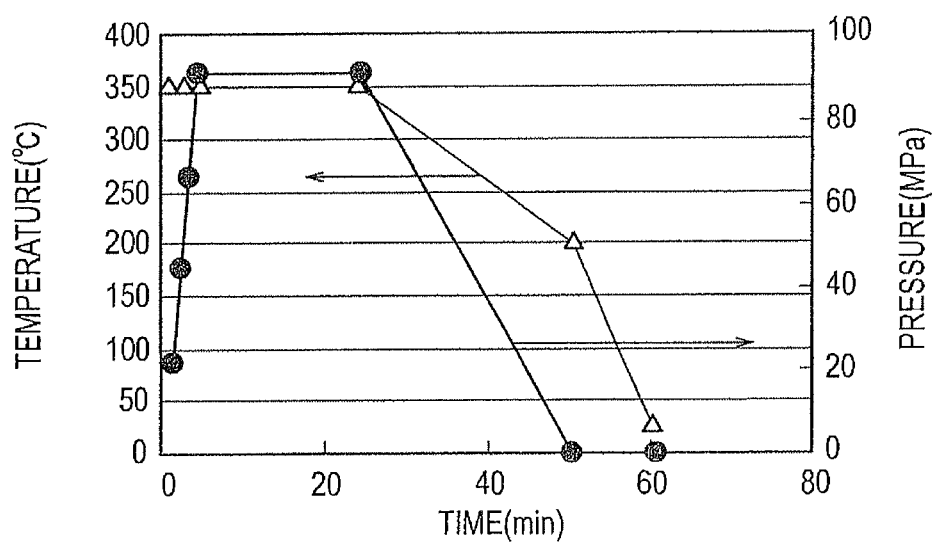
FIG. 17 shows an example of a temperature profile and an example of a pressure profile under the pressure/heating process, in the fabrication method for the semiconductor device according to the embodiment.

FIG. 17 shows an example of a temperature profile and an example of a pressure profile under the solid phase diffusion bonding process. In the example of FIG. 17, the pressure of about 90 MPa is applied in an initial state. Then, while this pressure is held, the heating processing temperature is risen from normal temperature to 350 degrees C. within about 5 minutes. Next, the pressure of about 90 MPa and the heating processing temperature at about 350 degrees C. are held during about 20 minutes. Next, during about 25 minutes, the pressure is reduced from about 90 MPa to atmospheric pressure, and the heating processing temperature is reduced from about 350 degrees C. to about 200 degrees C. Next, during about 25 minutes, the heating processing temperature is reduced from about 200 degrees C. to normal temperature. As clearly from FIG. 17, since the pressure/heating process is completed within about 1 hour, shortening of the process time can be achieved.

Figure 18:
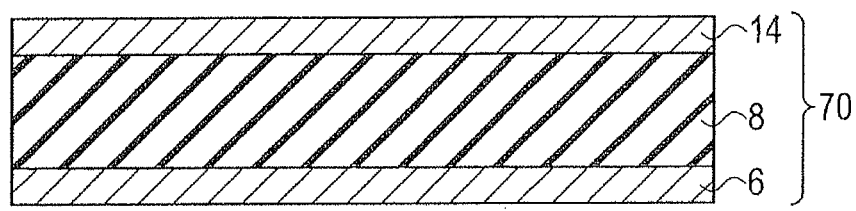
FIG. 18 is a schematic cross-sectional configuration diagram showing a mounting substrate applied to the fabrication method for the semiconductor device according to the embodiment.

As shown in FIG. 18, a schematic cross-sectional configuration of the mounting substrate 70 applied to the semiconductor device according to the embodiment may include metal layers 14 and 6 formed on the surface and the back side surface of the insulating substrate 8. In this case, the metal layers 14 and 6 may be formed with a Cu electrode or an Al electrode on the surface of the mounting substrates 70 (e.g., a Direct Bonding Copper (DBC) substrate or Direct Brazed Aluminum (DBA)). The Cu electrode and Al electrode may be patterned to form the signal wiring electrode 12 and the power wiring electrode 16 on the insulating substrate 8. Alternatively, the signal wiring electrode 12 and the power wiring electrode 16 may be patterned on the insulating substrate 8, using the plating technology, the sputtering technology, or the vacuum evaporation technology.

Figure 19:
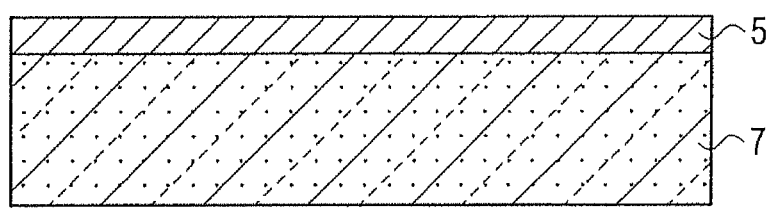
FIG. 19 is a schematic cross-sectional configuration diagram showing a semiconductor substrate applied to the fabrication method for the semiconductor device according to the embodiment.

Since surface flatness of the substrate is required in order to form the drain solid phase diffusion bonding, the semiconductor substrates 7 (e.g., a silicon wafer) are also applicable instead of the mounting substrate 70, as shown in FIG. 19. In the example of FIG. 19, a metal layer 5 is formed on the semiconductor substrate 7.

The metal layers 14, 6, and 5 can be formed of Ag, Au, Ti, Ni, etc. using the plating technology, the sputtering technology, or the vacuum evaporation technology.
(Die Shear Strength Test)

In the semiconductor device 1 according to the embodiment, as a result of performing a die shear strength test about the drain solid phase diffusion bonding between the drain pad electrode 36 and the drain connector DC of the semiconductor chip 10, same grade bonding as a conventional Pb solder bonding or high intensity bonding rather than the conventional Pb solder bonding is obtained under the room temperature or under the environment of 300 degrees C.
(Thermal Cycle Test)

Figure 20:
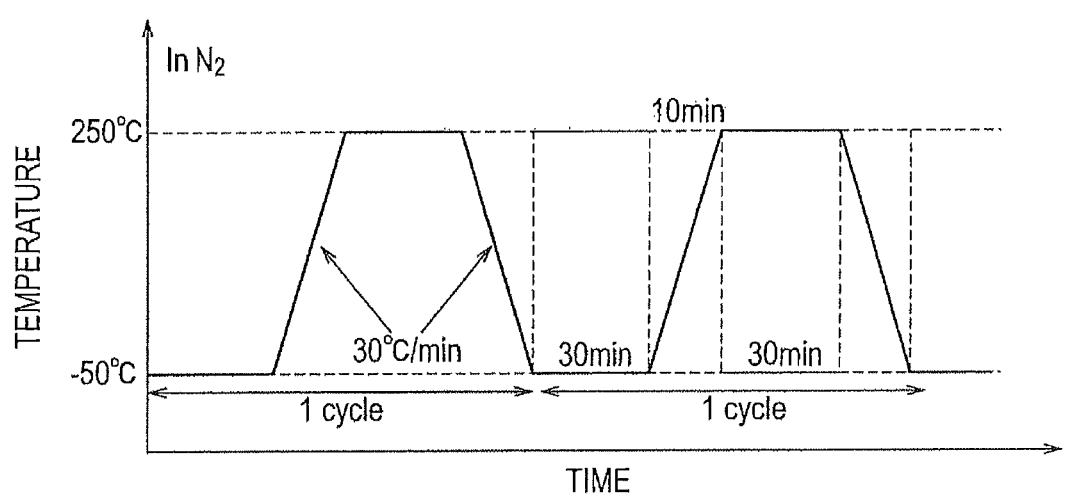
FIG. 20 shows an example of a temperature profile under a thermal cycle test subjected to the semiconductor device according to the embodiment.

FIG. 20 shows an example of a temperature profile under a thermal cycle test subjected to the semiconductor device 1 according to the embodiment. The thermal cycle test was performed over a range from −50 degrees C. to +250 degrees C. under a nitrogen atmosphere. A time period of one heat cycle is 80 minutes. The breakdown of one heat cycle is as follows: a time period at a temperature of −50 degrees C. is 30 minutes; a heating time period at a temperature from −50 degrees C. to +250 degrees C. is 10 minutes; a time period at a temperature of +250 degrees C. is 30 minutes; and the cooling time period at a temperature from +250 degrees C. to −50 degrees C. is 10 minutes. Characteristic degradation is not observed as a result of measuring the value of the forward voltage drop Vf and the value of the reverse breakdown voltage Vr every 100 cycles.

Bonding strength of the solid phase diffusion bonding layers 48S, 48G, 48D and 48H formed by using the fabrication method of the semiconductor device 1 according to the embodiment is sufficiently secured as a result of the above thermal cycle test.

According to the semiconductor device according to the embodiment and the fabrication method of such semiconductor device, since the solid phase diffusion bonding layer has bonding heat resistance reached to the melting point specific to Ag or Au, the semiconductor chip can be driven at high temperature by applying the solid phase diffusion bonding layer to the SiC based or GaN based power device etc.

According to the embodiment, since the electrical conductivity and thermal conductivity of the solid phase diffusion bonding layer are higher than those of the conventional low melting point solder, it is achievable the semiconductor device having enhanced electrical efficiency and enhanced thermal efficiency.

According to the semiconductor device according to the embodiment and the fabrication method for such semiconductor device, since the solid phase diffusion bonding layer having the high melting point can be formed under the low-temperature process, damage to the materials can be reduced at the time of the fabricating process.

According to the embodiment, since the almost same process temperature and the almost same time period as the Pb solder which is the conventional high melting point solder by applying the solid phase diffusion bonding can be achieved, it can provide the semiconductor device suitable for mass productivity.

According to the semiconductor device according to the embodiment and the fabrication method for such semiconductor device, large capacity, mass production, shortening of process time, and simplification of processes are easily achievable, since the structure of disposing a plurality of the semiconductor chips in parallel can be also formed in the simultaneous processes.

In the semiconductor device according to the embodiment and the fabrication method for such semiconductor device, since the electrode connection by the solid phase diffusion bonding is performed, a wirebondless structure can be perfectly achieved. Accordingly, the reliability at the time of fabricating can be enhanced, and parasitic inductances which a bonding wire has are reduced, and therefore high speed switching performance and high frequency driving performance can be achieved.

According to the semiconductor device according to the embodiment, and the fabrication method of the semiconductor device, since the double-sided cooling structure for cooling the semiconductor chip from both sides of the mounting substrate and the drain connector DC can be achieved, it is excellent in heat radiation performance.

According to the semiconductor device according to the embodiment, and the fabrication method of the semiconductor device, since the solid phase diffusion bonding is formed in each of the gate connector, the source connector and the drain connector of the semiconductor chip by using the solid phase diffusion technology, high temperature bonding becomes achievable, thereby offering the outstanding operating performance at high temperature of the semiconductor chips (e.g., a SiC based semiconductor chip or a GaN based semiconductor chip) to be mounted.

According to the preset invention, it can provide the semiconductor device having the flip chip structure whose process temperature becomes lowered temperature and process time length also can be shortened by using the solid phase diffusion bonding, and provide the fabrication method of such semiconductor device.

[Other Embodiments]

While the present invention is described in accordance with the aforementioned embodiment, it should be understood that the description and drawings that configure part of this disclosure are not intended to limit the present invention. This disclosure makes clear a variety of alternative embodiments, working examples, and operational techniques for those skilled in the art.

Such being the case, the present invention covers a variety of embodiments, whether described or not.

INDUSTRIAL APPLICABILITY

The semiconductor device of a present invention can be used in general power devices (e.g., a power semiconductor module, an intelligent power module).

What is claimed is:

1. A semiconductor device comprising:
an insulating substrate;
a signal wiring electrode disposed on the insulating substrate;
a power wiring electrode disposed on the insulating substrate or disposed so as to pass through the insulating substrate;
a semiconductor chip disposed in flip chip orientation on the insulating substrate and including a semiconductor substrate;
a source pad electrode and a gate pad electrode disposed face down on a surface of the semiconductor substrate; and
a drain pad electrode disposed face up on a back side surface of the semiconductor substrate;
a gate connector disposed on the gate pad electrode;
a source connector disposed on the source pad electrode;
wherein the material of the gate pad electrode and the material of the gate connector are the same, and the material of the source pad electrode and the material of the source connector are the same;
a gate bonding layer configured to bond between the gate connector and the gate pad electrode, and a gate connector bonding layer configured to bond between the gate connector and the signal wiring electrode; and
a source bonding layer configured to bond between the source connector and the source pad electrode,
and a source connector bonding layer configured to bond between the source connector and the power wiring electrode,
wherein the gate bonding layer, the gate connector bonding layer, the source bonding layer, and the source connector bonding layer are respectively structured of one kind of metal comprising one of a group consisting of Ag, Au, Ti, Ni, Al, and Cu;
the gate bonding layer, the gate connector bonding layer, the source bonding layer, and the source connector bonding layer are bonding layers respective configured to bond between a same one kind of metals selected from a group consisting of Ag, Au, Ti, and Ni;

the interface between the bonding metallic material of the gate connector and the bonding metallic material of the gate pad electrode is seamless, and the interface between the bonding metallic material of the source connector and the bonding metallic material of the source pad electrode is seamless;

and the gate bonding layer is a layer separate from the gate pad electrode and the gate connector, and the source bonding layer is a layer separate from the source pad electrode and the source connector.

2. The semiconductor device according to claim 1, further comprising: a heat spreader configured to mount the insulating substrate, wherein between the insulating substrate and the heat spreader are bonded.

3. The semiconductor device according to claim 1 further comprising: a drain connector disposed on the drain pad electrode; and a drain bonding layer configured to bond between the drain connector and the drain pad electrode.

4. The semiconductor device according to claim 1, wherein the gate connector has a reverse-T shaped configuration, and a size of a contact area between the gate connector and the signal wiring electrode is wider than a size of a contact areas between the gate connector and the gate pad electrode.

5. The semiconductor device according to claim 1, wherein the semiconductor device comprises a plurality of the semiconductor chips, and a plurality of the gate connectors of the semiconductor chips can be simultaneously bonded to the gate pad electrodes.

6. The semiconductor device according to claim 1, wherein the semiconductor device comprises a plurality of the semiconductor chips, and a plurality of the source connectors of the semiconductor chips can be simultaneously bonded to the source pad electrodes.

7. The semiconductor device according to claim 3, wherein the semiconductor device comprises a plurality of the semiconductor chips, and a plurality of the drain pad electrodes of the semiconductor chips can be simultaneously bonded to the drain connector.

8. The semiconductor device according to claim 2 further comprising: a metal layer disposed on a back side surface of the insulating substrate; and a heat spreader bonding layer configured to bond between the metal layer and the heat spreader.

9. The semiconductor device according to claim 1, wherein the gate bonding layer and the gate connector bonding layer are bonding layers respectively configured to bond between the a same one kind of metals selected from the group consisting of Ag, Au, Ti and Ni, wherein material not listed in the group is precluded from the bonding of the one kind of metal.

10. The semiconductor device according to claim 1, wherein the source bonding layer and the source connector bonding layer are bonding layers respectively configured to bond between the a same one kind of metal selected from the group consisting of Ag, Au, Ti and Ni, wherein material not listed in the group is precluded from the bonding of the one kind of metal.

11. The semiconductor device according to claim 1, wherein the drain bonding layer is a bonding layer configured to bond between the a same one or more kinds of metals selected from the group consisting of Ag, Au, Ti and Ni, wherein material not listed in the group is precluded from the bonding of the one kind of metal.

12. The semiconductor device according to claim 8, wherein the heat spreader bonding layer is a bonding layer respectively configured to bond between the a same one or more kinds of metals selected from the group consisting of Ag, Au, Ti and Ni, wherein material not listed in the group is precluded from the bonding of the one kind of metal.

13. The semiconductor device according to claim 1, wherein the gate connector and the source connector are formed of one selected from the group consisting of Al, Cu, CuMo, CuW, and AlSiC.

14. The semiconductor device according to claim 1, wherein the semiconductor chip is a power device of one selected from the group consisting of an SiC based power device, a GaN based power device, and an AlN based power device.

15. The semiconductor device according to claim 1, wherein the semiconductor device uses a semiconductor having a bandgap energy of 1.1 eV to 8 eV.

16. The semiconductor device according to claim 1, wherein respective melting points of the gate bonding layer, the gate connector bonding layer, the source bonding layer, and the source connector bonding layer are approximately equal to the melting point of the one kind of the metal.

17. The semiconductor device according to claim 1, wherein the respective melting points of the gate bonding layer, the gate connector bonding layer, the source bonding layer, and the source connector bonding layer are higher than 430 degrees C.

* * * * *